United States Patent [19]

Krol et al.

[11] Patent Number: 4,512,020
[45] Date of Patent: Apr. 16, 1985

[54] DATA PROCESSING DEVICE FOR PROCESSING MULTIPLE-SYMBOL DATA-WORDS BASED ON A SYMBOL-CORRECTING CODE AND HAVING MULTIPLE OPERATING MODES

[75] Inventors: Thijs Krol, Eindhoven; Bernardus J. Vonk, Hilversum, both of Netherlands

[73] Assignee: U.S. Philips Corporation, New York, N.Y.

[21] Appl. No.: 416,992

[22] Filed: Sep. 13, 1982

[30] Foreign Application Priority Data

Sep. 21, 1981 [NL] Netherlands ............................ 8104342

[51] Int. Cl.³ ............................................. G06F 11/10
[52] U.S. Cl. ........................................... 371/37; 371/43
[58] Field of Search ...................... 371/37, 39, 43, 44

[56] References Cited

U.S. PATENT DOCUMENTS

| | | | |
|---|---|---|---|
| 4,117,458 | 9/1978 | Burghard et al. | 371/37 |
| 4,165,444 | 8/1979 | Gordon | 371/43 X |
| 4,355,391 | 10/1982 | Alsop | 371/37 |
| 4,382,300 | 5/1983 | Gupta | 371/37 |
| 4,414,667 | 11/1983 | Bennett | 371/37 |

*Primary Examiner*—Charles E. Atkinson
*Assistant Examiner*—Mark Ungerman
*Attorney, Agent, or Firm*—Jack E. Haken; James J. Cannon, Jr.

[57] ABSTRACT

A computer system based on a symbol-correcting code. The code words consist of a number of code symbols. In the normal operating mode of the error correction members, correction is possible of all errors which are either limited to one code symbol or which concern only two arbitrarily situated code bits. During operation in the erasure mode, a predetermined code symbol within the code word is not taken into account; therefore, it may contain an arbitrary, unknown error. An error can be corrected which concerns only one arbitrarily situated code bit. In the selection mode, two predetermined code symbols within the code word are not taken into account. The data words can be reconstructed from the others. The mode is controlled by the content of the mode register. The mode register is controlled by the output signals of syndrome generators.

8 Claims, 38 Drawing Figures

| | | | | | | | | | | | | | | | | | | | |
|---|---|---|---|---|---|---|---|---|---|---|---|---|---|---|---|---|---|---|---|
| $\underline{0}$ | 0 | 0 | 0 | 0 | $a^3$ | 1 | 0 | 0 | 0 | $a^7$ | 1 | 0 | 1 | 1 | $a^{11}$ | 1 | 1 | 1 | 0 |
| $a^0$ | 0 | 0 | 0 | 1 | $a^4$ | 0 | 0 | 1 | 1 | $a^8$ | 0 | 1 | 0 | 1 | $a^{12}$ | 1 | 1 | 1 | 1 |
| $a^1$ | 0 | 0 | 1 | 0 | $a^5$ | 0 | 1 | 1 | 0 | $a^9$ | 1 | 0 | 1 | 0 | $a^{13}$ | 1 | 1 | 0 | 1 |
| $a^2$ | 0 | 1 | 0 | 0 | $a^6$ | 1 | 1 | 0 | 0 | $a^{10}$ | 0 | 1 | 1 | 1 | $a^{14}$ | 1 | 0 | 0 | 1 |
| | | | | | | | | | | | | | | | $a^{15}$ | 0 | 0 | 0 | 1 |

FIG. 1

$$[G] = \begin{bmatrix} a^0 & \underline{0} \\ \underline{0} & a^0 \\ a^7 & a^{11} \\ a^{11} & a^7 \end{bmatrix} \qquad [H] = \begin{bmatrix} a^7 & a^{11} & a^0 & \underline{0} \\ a^{11} & a^7 & \underline{0} & a^0 \end{bmatrix}$$

FIG. 2

$$\begin{bmatrix} a^0 & \underline{0} \\ \underline{0} & a^0 \end{bmatrix} \cdot \begin{bmatrix} a^0 & \underline{0} & a^6 & a^{10} \\ \underline{0} & a^0 & a^{10} & a^6 \end{bmatrix} = \begin{bmatrix} a^0 & \underline{0} & a^6 & a^{10} \\ \underline{0} & a^0 & a^{10} & a^6 \end{bmatrix}$$

$$\begin{bmatrix} a^7 & a^{11} \\ a^{11} & a^7 \end{bmatrix} \cdot \begin{bmatrix} a^0 & \underline{0} & a^6 & a^{10} \\ \underline{0} & a^0 & a^{10} & a^6 \end{bmatrix} = \begin{bmatrix} a^7 & a^{11} & a^0 & \underline{0} \\ a^{11} & a^7 & \underline{0} & a^0 \end{bmatrix}$$

$$\begin{bmatrix} a^0 & a^{11} \\ \underline{0} & a^5 \end{bmatrix} \cdot \begin{bmatrix} a^0 & \underline{0} & a^6 & a^{10} \\ \underline{0} & a^0 & a^{10} & a^6 \end{bmatrix} = \begin{bmatrix} a^0 & a^{11} & \underline{0} & a^7 \\ \underline{0} & a^5 & a^0 & a^{11} \end{bmatrix}$$

$$\begin{bmatrix} a^0 & a^4 \\ \underline{0} & a^9 \end{bmatrix} \cdot \begin{bmatrix} a^0 & \underline{0} & a^6 & a^{10} \\ \underline{0} & a^0 & a^{10} & a^6 \end{bmatrix} = \begin{bmatrix} a^0 & a^4 & a^8 & \underline{0} \\ \underline{0} & a^9 & a^4 & a^0 \end{bmatrix}$$

FIG. 3

$$\begin{bmatrix} c_3 \\ c_2 \\ c_1 \\ c_0 \end{bmatrix} = \begin{bmatrix} a^0 & 0 \\ 0 & a^0 \\ a^7 & a^{11} \\ a^{11} & a^7 \end{bmatrix} \cdot \begin{bmatrix} d_1 \\ d_0 \end{bmatrix}$$

$$\begin{bmatrix} c_3 \\ c_2 \end{bmatrix} = \begin{bmatrix} a^0 & 0 \\ 0 & a^0 \end{bmatrix} \cdot \begin{bmatrix} d_1 \\ d_0 \end{bmatrix} \longrightarrow \begin{bmatrix} d_1 \\ d_0 \end{bmatrix} = \begin{bmatrix} a^0 & 0 \\ 0 & a^0 \end{bmatrix} \cdot \begin{bmatrix} c_3 \\ c_2 \end{bmatrix}$$

$$\begin{bmatrix} c_3 \\ c_1 \end{bmatrix} = \begin{bmatrix} a^0 & 0 \\ a^7 & a^{11} \end{bmatrix} \cdot \begin{bmatrix} d_1 \\ d_0 \end{bmatrix} \longrightarrow \begin{bmatrix} d_1 \\ d_0 \end{bmatrix} = \begin{bmatrix} a^0 & 0 \\ a^{11} & a^4 \end{bmatrix} \cdot \begin{bmatrix} c_3 \\ c_1 \end{bmatrix}$$

$$\begin{bmatrix} c_3 \\ c_0 \end{bmatrix} = \begin{bmatrix} a^0 & 0 \\ a^{11} & a^7 \end{bmatrix} \cdot \begin{bmatrix} d_1 \\ d_0 \end{bmatrix} \longrightarrow \begin{bmatrix} d_1 \\ d_0 \end{bmatrix} = \begin{bmatrix} a^0 & 0 \\ a^4 & a^8 \end{bmatrix} \cdot \begin{bmatrix} c_3 \\ c_0 \end{bmatrix}$$

$$\begin{bmatrix} c_2 \\ c_1 \end{bmatrix} = \begin{bmatrix} 0 & a^0 \\ a^7 & a^{11} \end{bmatrix} \cdot \begin{bmatrix} d_1 \\ d_0 \end{bmatrix} \longrightarrow \begin{bmatrix} d_1 \\ d_0 \end{bmatrix} = \begin{bmatrix} a^4 & a^8 \\ a^0 & 0 \end{bmatrix} \cdot \begin{bmatrix} c_2 \\ c_1 \end{bmatrix}$$

$$\begin{bmatrix} c_2 \\ c_0 \end{bmatrix} = \begin{bmatrix} 0 & a^0 \\ a^{11} & a^7 \end{bmatrix} \cdot \begin{bmatrix} d_1 \\ d_0 \end{bmatrix} \longrightarrow \begin{bmatrix} d_1 \\ d_0 \end{bmatrix} = \begin{bmatrix} a^{11} & a^4 \\ a^0 & 0 \end{bmatrix} \cdot \begin{bmatrix} c_2 \\ c_0 \end{bmatrix}$$

$$\begin{bmatrix} c_1 \\ c_0 \end{bmatrix} = \begin{bmatrix} a^7 & a^{11} \\ a^{11} & a^7 \end{bmatrix} \cdot \begin{bmatrix} d_1 \\ d_0 \end{bmatrix} \longrightarrow \begin{bmatrix} d_1 \\ d_0 \end{bmatrix} = \begin{bmatrix} a^6 & a^{10} \\ a^{10} & a^6 \end{bmatrix} \cdot \begin{bmatrix} c_1 \\ c_0 \end{bmatrix}$$

FIG.4

$$\begin{bmatrix} a^{10} & a^6 \\ a^6 & a^{10} \\ 0 & a^4 \\ a^8 & 0 \end{bmatrix} \cdot \begin{bmatrix} a^7 & a^{11} & a^0 & 0 \\ a^{11} & a^7 & 0 & a^0 \end{bmatrix} = \begin{bmatrix} 0 & a^0 & a^{10} & a^6 \\ a^0 & 0 & a^6 & a^{10} \\ a^0 & a^{11} & 0 & a^4 \\ a^0 & a^4 & a^8 & 0 \end{bmatrix}$$

FIG.5

$$\begin{pmatrix} 0 & a^0 & a^{10} & a^6 \\ a^0 & 0 & a^6 & a^{10} \\ a^0 & \bar{a}^{11} & 0 & a^4 \\ a^0 & a^4 & \bar{a}^8 & 0 \\ a^{11} & 0 & a^4 & \bar{0} \\ a^4 & \bar{0} & 0 & \bar{a}^8 \end{pmatrix} \cdot \begin{pmatrix} c_3 \\ c_2 \\ c_1 \\ c_0 \end{pmatrix} = \begin{pmatrix} s_3 \\ s_2 \\ s_1 \\ s_0 \\ t_1 \\ t_0 \end{pmatrix}$$

$$y_{32} = \begin{bmatrix} y_{321} \\ y_{320} \end{bmatrix} = \begin{bmatrix} a^0 & 0 \\ 0 & a^0 \end{bmatrix} \begin{bmatrix} c_3 \\ c_2 \end{bmatrix} = \begin{bmatrix} c_3 \\ c_2 \end{bmatrix}$$

$$y_{31} = \begin{bmatrix} y_{311} \\ y_{310} \end{bmatrix} = \begin{bmatrix} a^0 & 0 \\ a^{11} & a^4 \end{bmatrix} \begin{bmatrix} c_3 \\ c_2 \end{bmatrix} = \begin{bmatrix} c_3 \\ a^{11}c_3 + a^4 c_1 \end{bmatrix} = \begin{bmatrix} c_3 \\ t_1 \end{bmatrix}$$

$$y_{30} = \begin{bmatrix} y_{301} \\ y_{300} \end{bmatrix} = \begin{bmatrix} a^0 & 0 \\ a^4 & a^8 \end{bmatrix} \begin{bmatrix} c_3 \\ c_0 \end{bmatrix} = \begin{bmatrix} c_3 \\ a^4 c_3 + a^8 c_0 \end{bmatrix} = \begin{bmatrix} c_3 \\ t_0 \end{bmatrix}$$

$$y_{21} = \begin{bmatrix} y_{211} \\ y_{210} \end{bmatrix} = \begin{bmatrix} a^4 & a^8 \\ a^0 & 0 \end{bmatrix} \begin{bmatrix} c_2 \\ c_1 \end{bmatrix} = \begin{bmatrix} a^0 & a^4 & a^8 & 0 \\ 0 & a^0 & 0 & 0 \end{bmatrix} \begin{bmatrix} c_3 \\ c_2 \\ c_1 \\ c_0 \end{bmatrix} + \begin{bmatrix} a^0 & 0 & 0 & 0 \\ 0 & 0 & 0 & 0 \end{bmatrix} \begin{bmatrix} c_3 \\ c_2 \\ c_1 \\ c_0 \end{bmatrix} =$$

$$= \begin{bmatrix} s_0 \\ c_2 \end{bmatrix} + \begin{bmatrix} c_3 \\ 0 \end{bmatrix} = \begin{bmatrix} s_0 + c_3 \\ c_2 \end{bmatrix}$$

$$y_{20} = \begin{bmatrix} y_{201} \\ y_{200} \end{bmatrix} = \begin{bmatrix} a^{11} & a^4 \\ a^4 & 0 \end{bmatrix} \begin{bmatrix} c_2 \\ c_1 \end{bmatrix} = \begin{bmatrix} a^0 & a^{11} & 0 & a^4 \\ 0 & a^0 & 0 & 0 \end{bmatrix} \begin{bmatrix} c_3 \\ c_2 \\ c_1 \\ c_0 \end{bmatrix} + \begin{bmatrix} a^0 & 0 & 0 & 0 \\ 0 & 0 & 0 & 0 \end{bmatrix} \begin{bmatrix} c_3 \\ c_2 \\ c_1 \\ c_0 \end{bmatrix} =$$

$$= \begin{bmatrix} s_1 \\ c_2 \end{bmatrix} + \begin{bmatrix} c_3 \\ 0 \end{bmatrix} = \begin{bmatrix} s_1 + c_3 \\ c_2 \end{bmatrix}$$

$$y_{10} = \begin{bmatrix} y_{101} \\ y_{100} \end{bmatrix} = \begin{bmatrix} a^6 & a^{10} \\ a^{10} & a^6 \end{bmatrix} \begin{bmatrix} c_1 \\ c_0 \end{bmatrix} = \begin{bmatrix} 0 & a^0 & a^{10} & a^6 \\ a^0 & 0 & a^6 & a^{10} \end{bmatrix} \begin{bmatrix} c_3 \\ c_2 \\ c_1 \\ c_0 \end{bmatrix} + \begin{bmatrix} 0 & a^0 & 0 & 0 \\ a^0 & 0 & 0 & 0 \end{bmatrix} \begin{bmatrix} c_3 \\ c_2 \\ c_1 \\ c_0 \end{bmatrix} =$$

$$= \begin{bmatrix} s_3 \\ s_2 \end{bmatrix} \begin{bmatrix} c_2 \\ c_3 \end{bmatrix} = \begin{bmatrix} s_3 + c_2 \\ s_2 + c_3 \end{bmatrix}$$

FIG.8

| MOD 3 2 1 0 | MODE | OPERATION |
|---|---|---|
| 0 0 0 0 | RM = 1 | RANDOM MODE |
| 0 0 0 1 | $EM_0 = 1$ | ERASURE ZONE 0 |
| 0 0 1 0 | $EM_1 = 1$ | ERASURE ZONE 1 |
| 0 0 1 1 | $MOS_{32} = 1$ | ZONES 2 AND 3 ONLY |
| 0 1 0 0 | $EM_2 = 1$ | ERASURE ZONE 2 |
| 0 1 0 1 | $MOS_{31} = 1$ | ZONES 1 AND 3 ONLY |
| 0 1 1 0 | $MOS_{30} = 1$ | ZONES 0 AND 3 ONLY |
| 0 1 1 1 | . | |
| 1 0 0 0 | $EM_3 = 1$ | ERASURE ZONE 3 |
| 1 0 0 1 | $MOS_{21} = 1$ | ZONES 1 AND 2 ONLY |
| 1 0 1 0 | $MOS_{20} = 1$ | ZONES 0 AND 2 ONLY |
| 1 0 1 1 | . | |
| 1 1 0 0 | $MOS_{10} = 1$ | ZONES 0 AND 1 ONLY |
| 1 1 0 1 | . | |
| 1 1 1 0 | . | |
| 1 1 1 1 | . | |

| ZONES | q32 q31 q30 | q23 q21 q20 | q13 q12 q10 | q03 q02 q01 | p3 p2 p1 p0 | MOD | ERROR CODE | ERR 3 2 1 0 |
|---|---|---|---|---|---|---|---|---|
| 3 2 | | | 1 | 1 | 1 1<br>1 0<br>0 1<br><br><br><br><br>1 | RM<br>RM<br>RM<br>RM<br>$EM_0$<br>$EM_1$<br>$EM_0$<br>$EM_1$<br>$MOS_{32}$ | NE<br>SSE1<br>SSE0<br>DBE 0,1<br>EE0, BE1<br>EE1, BE0<br>EE0, NBE<br>EE1, NBE | 0 0 0 0<br>0 0 1 0<br>0 0 0 1<br>0 0 1 1<br>0 0 1 0<br>0 0 0 1<br>0 0 0 0<br>0 0 0 0 |
| 3 1 | | 1<br>1 | 1 | 1<br>1 | | RM<br>$EM_0$<br>$EM_2$<br>$MOS_{31}$ | DBE 0,2<br>EE0, BE2<br>EE2, BE0 | 0 1 0 1<br>0 1 0 0<br>0 0 0 1 |
| 3 0 | | 1<br>1 | 1<br>1 | | | RM<br>$EM_1$<br>$EM_2$<br>$MOS_{30}$ | DBE 1,2<br>EE1, BE2<br>EE2, BE1 | 0 1 1 0<br>0 1 0 0<br>0 0 1 0 |
| 2 1 | 1<br>1 | | | 1<br>1 | | RM<br>$EM_0$<br>$EM_3$<br>$MOS_{31}$ | DBE 0,3<br>EE0, BE3<br>EE3, BE0 | 1 0 0 1<br>1 0 0 0<br>0 0 0 1 |
| 2 0 | 1<br>1 | | 1<br>1 | | | RM<br>$EM_1$<br>$EM_3$<br>$MOS_{20}$ | DBE 1,3<br>EE1, BE3<br>EE3, BE1 | 1 0 1 0<br>1 0 0 0<br>0 0 1 0 |
| 1 0 | 1<br>1 | 1<br>1 | | | 1 1<br>1 0<br>0 1<br><br><br><br><br>1 | RM<br>RM<br>RM<br>RM<br>$EM_2$<br>$EM_3$<br>$EM_2$<br>$EM_3$<br>$MOS_{10}$ | NE<br>SSE 3<br>SSE 2<br>DBE 2,3<br>EE2, BE3<br>EE3, BE2<br>EE2, NBE<br>EE3, NBE | 0 0 0 0<br>1 0 0 0<br>0 1 0 0<br>1 1 0 0<br>1 0 0 0<br>0 1 0 0<br>0 0 0 0<br>0 0 0 0 |

$y_{32}$: $RM.(p_0.p_1+p_0.\overline{p_1}+\overline{p_0}.p_1+q_{01}.q_{10})+EM_0.(q_{01}+p_0)+EM_1.(q_{10}+p_1)+MOS_{32}=1 \Longrightarrow$ $RM.(p_0+p_1+q_{01}.q_{10})+EM_0.(q_{01}+p_0)+EM_1.(q_{10}+p_1)+MOS_{32}=1 \Longrightarrow$ $(RM+EM_0+EM_1+MOS_{32}).(EM_0+q_{10}+p_1+RMp_0+MOS_{32}).$
$\qquad \cdot (EM_1+q_{01}+p_0+RMp_1+MOS_{32})=1 \qquad (29)$ $y_{31}$: $RM.q_{20}.q_{02}+EM_0.q_{02}+EM_2.q_{20}+MOS_{31}=1 \Longrightarrow$ $(RM+EM_0+EM_2+MOS_{31}).(q_{02}+EM_2+MOS_{31}).(q_{20}+EM_0+MOS_{31})=1 \qquad (30)$ $y_{30}$: $RM.q_{21}.q_{12}+EM_1.q_{12}+EM_2.q_{21}+MOS_{30}=1 \Longrightarrow$ $(RM+EM_1+EM_2+MOS_{30})(q_{12}+EM_2+MOS_{30})(q_{21}+EM_1+MOS_{30})=1 \qquad (31)$ $y_{21}$: $RM.q_{30}.q_{03}+EM_0.q_{03}+EM_3.q_{30}+MOS_{21}=1 \Longrightarrow$ $(RM+EM_0+EM_3+MOS_{21}).(q_{03}+EM_3+MOS_{21}).(q_{30}+EM_0+MOS_{21})=1 \qquad (32)$ $y_{20}$: $RM.q_{13}.q_{31}+EM_1.q_{13}+EM_3.q_{31}+MOS_{20}=1 \Longrightarrow$ $(RM+EM_1+EM_3+MOS_{20})(q_{13}+EM_3+MOS_{20})(q_{31}+EM_1+MOS_{20})=1 \qquad (33)$ $y_{10}$: $RM.(p_2+p_3+q_{23}+q_{32})+EM_3.(q_{23}+p_2)+EM_3.(q_{32}+p_3)+MOS_{10}=1 \Longrightarrow$ $(RM+EM_2+EM_3+MOS_{10}).(EM_2+q_{32}+p_3+RM.p_2+MOS_{10}). \qquad (34)$
$\qquad \cdot (EM_3+q_{23}+p_2+RM.p_3+MOS_{10})=1$

FIG.12

$$ER_0: \begin{array}{l} RM.p_0\overline{p_1}+RM.q_{01}\,q_{10}+RM.q_{02}\,q_{20}+RM.q_{03}\,q_{30}+ \\ EM_1\,q_{10}+EM_2\,q_{20}+EM_3\,q_{30}=1 \end{array} \quad (35) \quad \textbf{a}$$

$$ER_1: \begin{array}{l} RM.p_1\overline{p_0}+RM.q_{01}.q_{10}+RM.q_{12}.q_{21}+RM.q_{13}.q_{31}+ \\ EM_0.q_{01}+EM_2.q_{21}+EM_3.q_{31}=1 \end{array} \quad (36) \quad \textbf{b}$$

$$ER_2: \begin{array}{l} RM.\overline{p_3}p_2+RM.q_{02}.q_{20}+RM.q_{21}.q_{12}+RM.q_{23}.q_{32}+ \\ EM_0.q_{02}+EM_1.q_{12}+EM_3.q_{32}=1 \end{array} \quad (37) \quad \textbf{c}$$

$$ER_3: \begin{array}{l} RM.\overline{p_2}p_3+RM.q_{03}.q_{30}+RM.q_{31}.q_{13}+RM.q_{23}.q_{32}+ \\ EM_0.q_{03}+EM_1.q_{13}+EM_2.q_{23}=1 \end{array} \quad (38) \quad \textbf{d}$$

FIG. 20

$$\begin{array}{l} \overline{M_0}.\overline{M_2}.\overline{M_3}.\overline{p_1}.SEL_{01}.SEL_{10}+ \\ \overline{M_0}.\overline{M_1}.\overline{M_3}.SEL_{02}.SEL_{20}\quad + \\ \overline{M_0}.\overline{M_1}.\overline{M_2}.SEL_{03}.SEL_{30}=1 \end{array} \quad (46) \quad \textbf{a}$$

$$\begin{array}{l} \overline{M_1}.\overline{M_2}.\overline{M_3}.\overline{p_0}.SEL_{01}.SEL_{10}+ \\ \overline{M_0}.\overline{M_1}.\overline{M_3}.SEL_{12}.SEL_{21}\quad + \\ \overline{M_0}.\overline{M_1}.\overline{M_2}.SEL_{13}.SEL_{31}=1 \end{array} \quad (47) \quad \textbf{b}$$

$$\begin{array}{l} \overline{M_0}.\overline{M_1}.\overline{M_2}.\overline{p_3}.SEL_{23}.SEL_{32}+ \\ \overline{M_0}.\overline{M_2}.\overline{M_3}.SEL_{02}.SEL_{20}\quad + \\ \overline{M_0}.\overline{M_1}.\overline{M_2}.SEL_{12}.SEL_{21}=1 \end{array} \quad (48) \quad \textbf{c}$$

$$\begin{array}{l} \overline{M_0}.\overline{M_1}.\overline{M_2}.\overline{p_2}.SEL_{23}.SEL_{32}+ \\ \overline{M_0}.\overline{M_2}.\overline{M_3}.SEL_{03}.SEL_{30}\quad + \\ \overline{M_0}.\overline{M_1}.\overline{M_2}.SEL_{13}.SEL_{31}=1 \end{array} \quad (49) \quad \textbf{d}$$

FIG. 22

$$SEL_{01}.SEL_{10} = (EM_1 + q_{01} + p_0 + RM.p_1 + MOS_{32}) .$$
$$(EM_0 + q_{10} + p_1 + RM.p_0 + MOS_{32}) \implies$$

$$RM.\overline{p_0}.SEL_{01}.SEL_{10} = RM.q_{01}.q_{10} + RM.\overline{p_0}.p_1$$
$$RM.\overline{p_1}.SEL_{01}.SEL_{10} = RM.q_{01}.q_{10} + RM.\overline{p_1}.p_0$$
$$EM_0.\overline{p_0}.SEL_{01}.SEL_{10} = EM_0.q_{01}$$
$$EM_1.\overline{p_1}.SEL_{01}.SEL_{10} = EM_1.q_{10} \qquad (39) \quad \textbf{a}$$

$$SEL_{02}.SEL_{20} = (EM_2 + q_{02} + MOS_{31})(EM_0 + q_{20} + MOS_{31}) \implies$$

$$RM.SEL_{02}.SEL_{20} = RM.q_{02}.q_{20}$$
$$EM_0.SEL_{02}.SEL_{20} = EM_0.q_{02}$$
$$EM_2.SEL_{02}.SEL_{20} = EM_2.q_{20} \qquad (40) \quad \textbf{b}$$

$$SEL_{21}.SEL_{12} = (EM_2 + q_{12} + MOS_{30})(EM_1 + q_{21} + MOS_{30}) \implies$$

$$RM.SEL_{21}.SEL_{12} = RM.q_{12}.q_{21}$$
$$EM_1.SEL_{21}.SEL_{12} = EM_1.q_{12}$$
$$EM_2.SEL_{21}.SEL_{12} = EM_2.q_{21} \qquad (41) \quad \textbf{c}$$

FIG. 21

$$SEL_{03} \cdot SEL_{30} = (EM_3 + q_{03} + MOS_{21})(EM_0 + q_{30} + MOS_{21}) \Rightarrow$$

$$RM \cdot SEL_{03} \cdot SEL_{30} = RM \cdot q_{03} \cdot q_{30}$$
$$EM_0 \cdot SEL_{03} \cdot SEL_{30} = EM_0 \cdot q_{03}$$
$$EM_3 \cdot SEL_{03} \cdot SEL_{30} = EM_3 \cdot q_{30} \qquad (42) \qquad d$$

$$SEL_{13} \cdot SEL_{31} = (EM_1 + q_{31} + MOS_{20})(EM_3 + q_{13} + MOS_{20}) \Rightarrow$$

$$RM \cdot SEL_{31} \cdot SEL_{13} = RM \cdot q_{31} \cdot q_{13}$$
$$EM_1 \cdot SEL_{31} \cdot SEL_{13} = EM_1 \cdot q_{13}$$
$$EM_3 \cdot SEL_{13} \cdot SEL_{31} = EM_3 \cdot q_{31} \qquad (43) \qquad e$$

$$SEL_{32} \cdot SEL_{23} = (EM_2 + q_{32} + p_3 + RM \cdot p_2 + MOS_{10}) \cdot$$
$$(EM_3 + q_{23} + p_2 + RM \cdot p_2 + MOS_{10}) \Rightarrow$$

$$RM \cdot \overline{p_2} \, SEL_{32} \cdot SEL_{23} = RM \cdot q_{23} \cdot q_{32} + RM \cdot \overline{p_2} \, p_3$$
$$RM \cdot \overline{p_3} \, SEL_{32} \cdot SEL_{23} = RM \cdot q_{23} \cdot q_{32} + RM \cdot \overline{p_3} \, p_2$$
$$EM_2 \cdot \overline{p_2} \, SEL_{32} \cdot SEL_{23} = EM_2 \cdot q_{23}$$
$$EM_3 \cdot \overline{p_3} \, SEL_{32} \cdot SEL_{23} = EM_3 \cdot q_{32} \qquad (44) \qquad f$$

FIG. 21

$$H = \begin{bmatrix} a^0 & 0 & a^6 & a^{10} \\ 0 & a^0 & a^{10} & a^6 \end{bmatrix}$$

$$G = \begin{bmatrix} a^0 & 0 \\ 0 & a^0 \\ a^7 & a^{11} \\ a^{11} & a^7 \end{bmatrix} \quad \mathbf{a}$$

DATA PROCESSING DEVICE FOR PROCESSING MULTIPLE-SYMBOL DATA-WORDS BASED ON A SYMBOL-CORRECTING CODE AND HAVING MULTIPLE OPERATING MODES

BACKGROUND OF THE INVENTION

1. Field of the Invention

The invention relates to a data processing device for the processing of data words which are composed of $k=2p-2\geq 2$ data symbols by means of code words which are formed from the associated data words by means of an error-correcting code, said code words containing $n=2p$ code symbols, all symbols consisting of $m=2s\geq 4$ bits and forming part of a Galois field GF $(2^m)=\{\underline{0}, a^0, a^1 \ldots a^{2^m-2}\}$, said device comprising a first input for a data word, first multiplier means for multiplying the data word by a generator matrix [G] consisting of nxk matrix elements each of m bits in order to form a code word, processing means for processing the code word in order to form a processing result, and reconstruction means for reconstructing, using a parity check matrix [R] which is orthogonal to the generator matrix [G], the second data word associated with the processing result for output on a first output.

2. Description of the Prior Art

A device of this kind is known from U.S. Pat. No. 4,402,045 in the name of Applicant. The known device specifically concerns a multiprocessor computer system in which the digital data processing is organized according to n parallel processors for each processing the data word and in which the data storage is organized according to n memories which each store one respective code symbol of a resulting code word. The known device implements an error-correcting code which can operate in two modes:

(a) in a first, symbol-correcting operating mode one arbitrarily disturbed symbol can be corrected;

(b) in a second mode, referred to as the erasure mode, by ignoring a given symbol, for example a suspect symbol, a one-bit error in addition to the ignored symbol can be corrected.

SUMMARY OF THE INVENTION

The inventors of the present invention have found that a family of error-correcting codes exists which has more extensive error-correcting properties and which, moreover, can be used in many different categories of data processing devices. In order to derive full benefit therefrom, a data-processing device in accordance with the invention is characterized in that the reconstruction means comprise:

(a) second multiplier means with a second input for receiving the processing result for multiplication by a parity check matrix $[R]=[S][H][T]$ in order to form a number of at least $(n-k)=2t\geq 2$ syndrome symbols on a second output, [S[ being a non-singular matrix consisting of $(mk \times mk)$ bits, the matrix [H] comprising a first sub-matrix of $k \times k$ symbols in the form of an identity matrix and a second sub-matrix of $k \times (n-k)$ symbols whose determinant is not equal to $\underline{1}=a^0$, the absolute values modulo $(2^m-1)$ of the differences between the exponents of the symbols written as powers of (a) being at least equal to (m) on each respective row and on each respective column of the matrix [H], while each $(k \times k)$ sub-matrix of [H] is non-singular, the matrix T consisting of $(nm \times nm)$ bits in $n \times n$ blocks which are arranged in rows and columns and each of which blocks consists of $m \times m$ bits, each row and each column of blocks comprising $(n-1)$ blocks which consist exclusively of "0" bits, each row of bits and each column of bits containing bits;

(b) a mode register which has a third input and a third output, a first state of the mode register controlling a "normal" mode for processing the code words as forming part of a code with a minimum Hamming-distance of three over the symbols or a minimum Hamming-distance of five over the bits, n respective second states of the mode register controlling an erasure operation for a code symbol uniquely associated with the respective second state in order to process the remaining non-erased code symbols as forming a code word of a code having a minimum distance of three over the bits;

(c) a data reconstruction device with a fourth input for receiving the processing result and a fifth input for receiving the syndrome symbols, and with a fourth output for forming a reconstructed data word on the basis of associated sub-sets of k code symbols;

(d) a selection device with a sixth input which is connected to the second output in order to receive the syndrome symbols and a seventh input which is connected to the third output in order to receive the state information from the mode register, and also with a sixth output which is connected to the third input and a seventh output for supplying on the basis of the syndrome symbols and the state of the mode register, a selection signal for indicating the error-free code symbols and for supplying a set signal for the mode register;

(e) a gating device with inputs which are connected to the fourth output and the seventh output for the selection of a corrected data word.

In the normal mode a more extensive correction of errors is thus realized: for a minimum Hamming-distance of five, to arbitrary one-bit errors can thus be corrected. It is known that for such a minimum Hamming-distance two other operating modes are feasible:

(a) correction of one bit error and detection of two further one-bit errors, (b) detection of four arbitrary one-bit errors. "Arbitrary" is to be understood to mean herein "arbitrarily located". The matrix [H] already represents a considerable family of codes all of which are systematic codes. By multiplication by the matrix [S], non-systematic codes may also be obtained. The matrix [T] is a permutation matrix whereby rows, columns and, moreover, bits within the symbols can be permitted. When [S] and [T] are identity matrices, the original code remains unmodified. The mode register can be set on the basis of previously detected errors. Generally, for n=4, the mode register should contain at least three bits for the five operating modes. Said solution is particularly suitable for use with so-called "wild" logic. If preference is to be given to regular logic (read-only memories and programmable logic arrays), the reconstruction means may comprise:

(a) second multiplier means with a second input for receiving the processing result for multiplication by a parity check matrix $[R]=[S]\cdot[H]\cdot[T]$ in order to form a number of at least $(n-k)=2t$ 2 syndrome symbols on a second output, [S] being a non-singular matrix consisting of $(mk \times mk)$ bits, the matrix [H] comprising a first submatrix of $k \times k$ symbols formed as an identity matrix and a second sub-matrix of $k \times (n-k)$ symbols whose determinant is not equal to $a^0=\underline{1}$, the absolute values modulo $(2^m-1)$ of the differences between the exponents of the symbols expressed as powers of (a) being at least equal to (m) on each respective row and each respective column of the matrix [H], each (k×k) submatrix of [H] being non-singular, the matrix [T] consisting of (nm×nm) bits in n×n blocks which are arranged in rows and columns and each of which blocks consists of m×m bits, each row and each column of blocks comprising (n−1) blocks which consist exclusively of "0" bits, each column of bits containing exactly one "1" bit and for the remainder exclusively "0" bits;

(b) a mode register which has a third input and a third output, a first state of the mode register controlling a normal mode for processing the code words as forming part of a code with a minimum Hamming-distance of three over the symbols or a minimum Hamming-distance of five over the bits, n respective second states of the mode register controlling an erasure operation for a code symbol uniquely associated with the respective second state in order to process the remaining non-erased code symbols as forming a code word of a code having a minimum distance of three over the bits;

(c) correction determining means which have an eighth input which is connected to the second output in order to receive the syndrome symbols and a ninth input which is connected to the third output in order to receive the state information from the mode register, and also having an eighth output for supplying a corrector signal and a ninth output for supplying an error indication signal, the latter output being connected to the third input of the mode register;

(d) correction means, which have a tenth input, for receiving at least the data symbols of the processing result and for modulo-2 addition thereof to the corrector signal in order to supply a corrected data word on a tenth output. The two solutions are closely related and are equally usable for all codes per se. It has been found that multi-bit errors in a single symbol are caused notably by processor errors, for example, in a multiprocessor computer system; one-bit errors, however, are often due to memory malfunctions and of a temporary nature (so-called "soft errors"). It is to be noted that in the above definitions the valves of the exponent "h" of the symbol valve $0 = a^h$ is supposed to be "minus infinity".

Preferably, for n=4, k=2, the matrix [H] is chosen from:

$$[H_1] = \begin{bmatrix} a^0 & \underline{0} & a^6 & a^{10} \\ \underline{0} & a^0 & a^{10} & a^6 \end{bmatrix}$$

in which $a^i$ is an element of the Galois field GF($2^4$) generated with the primitive and irreducible polynomial $\pi(x) = x^4 + x + 1$, and $$[H_2] = \begin{bmatrix} a^0 & \underline{0} & a^5 & a^9 \\ \underline{0} & a^0 & a^9 & a^5 \end{bmatrix}$$

in which $a^j$ is an element of the Galois field GF($2^4$) generated by the primitive and irreducible polynomial $\pi'(x) = x^4 + x^3 + 1$. With a limited amount of redundancy, a large variety of one-symbol errors and one-bit errors can thus be corrected.

Preferably, the mode register contains n bits, each of which is assigned to a respective code symbol within the code word in order to control the erasure mode for this code symbol. Encoding and decoding of the mode register thus remains simple.

Preferably, there is provided an error register which comprises at least n bit locations and an eleventh input which is connected in parallel with the third input of the mode register in order to receive, upon detection of a correctable error in a symbol, a symbol indicator which is to be stored in an associated position of the error register, the symbol indicators received being continuously combined with a stored symbol indicator by means of a symbol-wise logic OR-function, the error register having an eleventh output for connection to an updating and control device, and also a reset input for receiving a reset signal from the control device. Thus, in addition to the short-term signalling of an error, long-term signalling can also be updated. In cases of doubt a more qualified judgment can thus be given concerning the reliability of a symbol having a given sequence number within the code word.

Preferably, the mode register has an additional data input and a load control input for receiving a control word from the control device in order to control the data processing device in a gating mode so that a data word is reconstructed by the selective erasure of (n−k) code symbols on the basis of the k code symbols then remaining, without correction of errors. The data processing device can thus continue even if (n−k) code symbols or code symbol locations contain more or less permanently unreliable data.

Preferably, there is provided a detector for detecting a multi-bit one-symbol error in the normal mode and for directly switching over the mode register to the erasure mode in reaction thereto, code symbols having the same symbol number as that in which the multi-bit one-symbol error occurred being subsequently erased. It has been found that such a multi-bit symbol error can be advantageously used to indicate an unreliable code symbol position.

Furthermore, using the present code, a multiprocessor system according to the state of the art can be advantageously extended when each sub-system also comprises its own mode register and its own error register for controlling the processing of the code symbols and for temporarily storing a detected error. Comparatively large sections of the system may then exhibit substantial faults for a more or less prolonged period of time, without the operation of the entire system being endangered.

BRIEF DESCRIPTION OF THE FIGURES

The invention will be described in detail hereinafter with reference to some figures.

FIG. 1 shows the sixteen elements of the Galois field GF($2^4$).

FIG. 2 shows the generator matrix and the parity check matrix of a specimen code.

FIG. 3 shows the method of forming other codes having the same properties as that associated with FIG. 2.

FIG. 4 shows the forming of the data symbols on the basis of all selections from the code symbols.

FIG. 5 shows the forming of an extended parity check matrix [Q] on the basis of the matrix [H].

FIGS. 7a, 7b show the matrix for the forming of the syndrome symbols as well as two additional auxiliary functions of code symbols.

FIG. 8 shows the forming of the data symbols of FIG. 4 utilizing the additional functions.

FIG. 10 shows the translation of the content of the mode register into the various operating modes.

FIG. 11 shows the translation of the syndrome symbol classes into the operating modes to be used.

FIG. 12 shows the conditions to be satisfied in order to enable the relevant selections to be made from the reconstructed versions of the data word.

FIGS. 20a ... d show the conditions for setting the respective bit positions of the error register.

FIGS. 21a ... 21f show the equations for deriving the selection signals for the respective versions of the data word.

FIGS. 22a ... 22d show a simpler formula for the conditions for setting the error register.

DESCRIPTION OF THE PREFERRED EMBODIMENT

DESCRIPTION OF THE CODE USED

Figure 6:
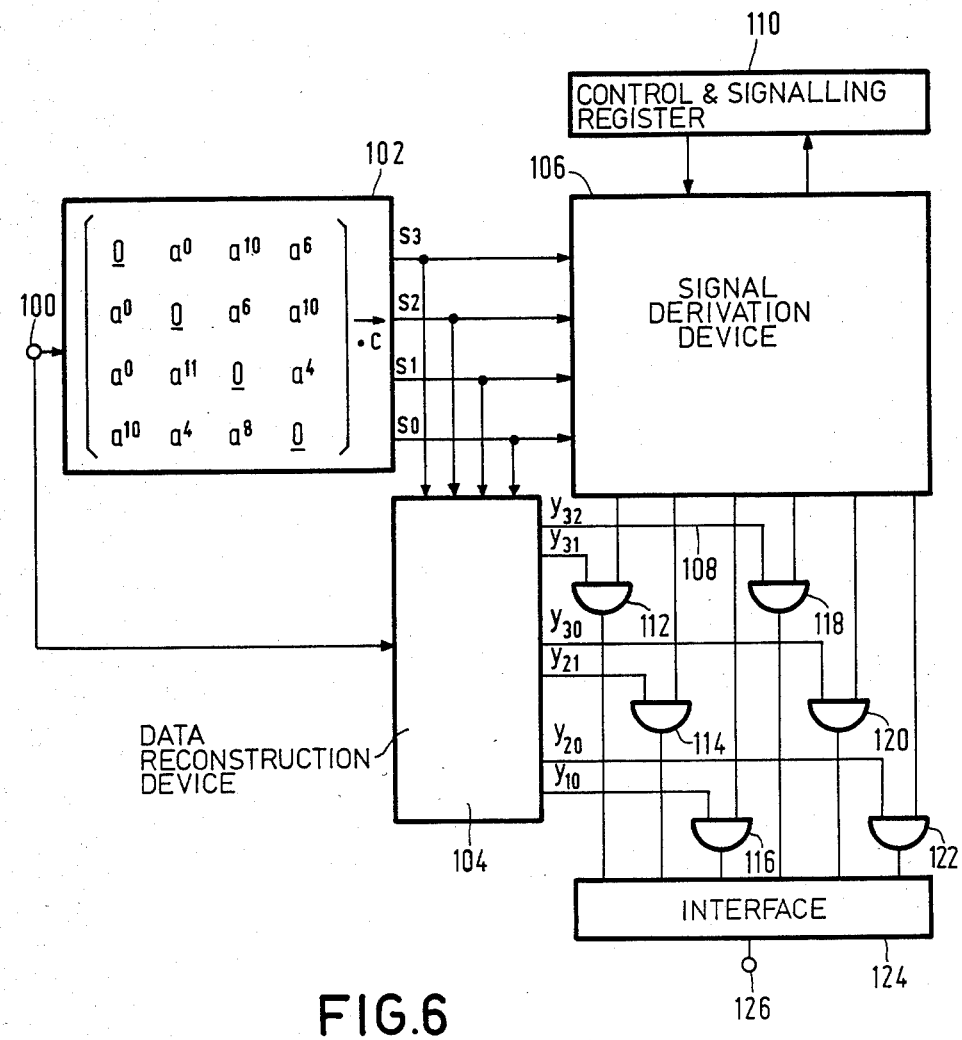
FIG. 6 shows an embodiment of a decoder.

The code used has been chosen in view of its symbol-correcting properties. A symbol consists of a fixed number of m bits and may then have $2^m$ different values. The set of $2^m$ symbols then forms a Galois field $GF(2^m)$ for which the algebraic operations are defined; for example, see the article by T. C. Bartee et al, Information and Control, Vol. 61 (1963), pages 79-98. In this respect, FIG. 1 shows the sixteen elements of the Galois field $GF(2^4)$, that is to say once written as a series of powers and once as respective bit groups. The bit groups can be formed by means of the primitive and irreducible polynomial $\pi(x) = x^4 + x + 1$. In this case and in many other cases several such polynomials are feasible. For example, the Balois field $GF(2^4)$ may alternatively be formed by the polynomial $\pi'(x) = x^4 + x^3 + 1$. The element (0000) is referred to as $\underline{0}$ and the element $a^0 = (0001)$ is referred to as $\underline{1}$.

The data words in the embodiment described consist of two symbols of four bits; the (redundant) code words consist of four symbols of four bits. For this code FIG. 2 shows the generator matrix [G] and the parity check matrix [H] whose elements are each four-bit symbols. Multiplication of the parity matrix [H] according to [S]·[H] by a non-singular matrix [S] of 2×2 symbols produces a transformed parity check matrix which imparts the same properties to the code as the original matrix [H].

The following variables of the code words will now be defined. $W_s$ is the symbol weight of a code word, that is to say the number of symbols of a code word which are not equal to the symbol $\underline{0}$ (0000). $W_b$ is the bit weight of a symbol, that is to say the number of bits of a symbol which are not equal to 0. The variable $d_s$ is the symbol weight of the code, that is to say the minimum symbol weight over all code words. In this respect it is assumed that the code words $(\underline{0000})$ and the symbol $\underline{0}$ (0000) are permissible. However, the occurrence of the code word $(\underline{0000})$ does not influence symbol weight of the code, which is based on the other code words only. Furthermore, only linear codes are considered, which means that the sum (bit-wise modulo-2) of two code words produces another code word. Consequently, the minimum symbol weight and the minimum code distance are identical. This has been demonstrated in the standard work in this field "Error correcting codes", by W. W. Peterson et al, MIT, Boston, 2nd edition, 1971.

The code has the following properties:

1. Because all (2×2) sub-matrices of the parity check matrix [H] are non-singular, the symbol weight $d_s$ of the code is greater than or equal to 3. This means that in all cases one arbitrarily disturbed symbol can be fully corrected.

2. There is no code word having the symbol weight 4 (i.e. without symbol $\underline{0}$) where the bit weight of all symbols equals 1.

All code words can be written as $$\vec{c} = (a^i, a^j, a^{7+i} + a^{11+j}, a^{11+i} + a^{7+j})$$

and for any combination i, j, satisfying $0 \leq i, j \leq 3$, there is no case where this results in the symbol weight 1 for the third and the fourth symbol. If this were not true, a pair of values i, j would exist $(i \neq j)$, with i, j $\epsilon\{0, 1, 2, 3\}$, so that $a^{7+i} + a^{11+j} \epsilon \{a^0, a^1, a^2, a^3\}$ and also $$a^{11+i} + a^{7+j} \epsilon \{a^0, a^1, a^2, a^3\}$$

When all possibilities are written in full, it becomes apparent that such a combination does not exist. Therefore, in the case of a symbol weight 4, at least one symbol has a bit weight $\geq 2$.

3. There is no code word having a symbol weight equal to 3 with two or three symbols having a bit weight equal to 1. It follows from the generator matrix that all code words having a symbol weight equal to 3 can be written as:

$$\begin{pmatrix} \underline{0}, a^i, a^{11+i}, a^{7+i} \\ a^i, \underline{0}, a^{7+i}, a^{11+i} \\ a^{4+i}, a^i, \underline{0}, a^{9+i} \\ a^i, a^{4+i}, a^{9+i}, \underline{0} \end{pmatrix}$$

Therein, i may have an arbitrary value (modulo-15), that is to say $i \epsilon \{0, 1, 2 ... 14\}$. It follows directly from the differences between the exponents of a that if one of the exponents has the value 0, 1, 2 or 3, the other two can never have one of these four values.

All cases concerning one-bit errors in two different symbols can thus be distinguished from one another. If this were not the case, in two different cases the code word thus disturbed would have to offer the same syndrome result after multiplication by the parity check matrix [H]. In other words, the bit-wise modulo-2 sum of the error vectors of the two cases should then form a code word, because the latter should produce a zero syndrome after multiplication by the parity check matrix. This bit-wise modulo-2 sum could occur only in the following manner:

(a) the symbol weight of the resulting word is two (one-bit errors two-by-two in the same symbol locations);

(b) the symbol weight of the resulting word is three, two symbols thereof having the bit weight 1; (two one-bit errors in the same symbol location, the other two in respective further symbol locations);

(c) the symbol weight of the resulting word is four; all symbols have the bit weight 1, all four one-bit errors in respective different symbol locations.

However, none of these cases produces a code word, so that two arbitrary one-bit errors can always be corrected.

The modulo-2 sum of one-symbol error and two one-bit errors could occur only in the following manner:

(a) the symbol weight equals two;

(b) the symbol weight equals three, two symbols then having the bit weight 1. However, none of these cases produce a code word so that an arbitrary symbol and also two arbitrary one-bit errors can always be corrected.

Furthermore, during erasure of a code symbol whose error locator is known but the magnitude of the error is not, moreover, a one-bit error can be corrected. This would be impossible only if two different one-bit errors would cause the same syndrome during the erasure of the same symbol. This would be possible only if:

a. the symbol weight of the code word equals two;

b. the code word has a symbol weight three, two symbols having a bit weight equal to one.

However, none of these cases occurs so that this one-bit error can also be corrected in the erasure mode.

FIG. 3 shows all possibilities for obtaining, by multiplication of the same matrix, all parity check matrices having the attractive properties described. Other (2×2) matrices can also be used for the multiplication, but no systematic codes are then obtained. Even though such codes have exactly the same error-correcting properties, the implementation thereof requires additional components. Further members of the same code family, having, therefore, the same error-correcting properties, can be found by:

a. permutation of the sequence of code symbols within a code word;

b. permutation of the sequence of the code bits within the respective code symbols;

c. multiplication of the parity check matrix [H], written as a bit matrix, by a non-singular matrix [T] consisting of 8×8 bits according to the formula [T]·[H];

d. starting with the other primitive and irreducible polynomial with inherent imaging of the series of powers in a on the sixteen elements of the Galois field GF ($2^4$), if desirable, combined with one (or more) of the above modifications in order to generate further members of the same code family.

The extended code family described herein is, therefore, the only family having the described properties for $n=4$, $k=2$ and $m=4$ (data words of two symbols of four bits and a redundancy degree of 2: code words of four symbols).

DESCRIPTION OF A DECODER

The encoder for such a code implements the multiplication of the data words by the generator matrix (which is derived from the parity check matrix in an elementary manner). This multiplication can be performed, for example, by means of a read-only memory (ROM). The decoder is more complex. It has been found that with the systematic codes of FIG. 3 the data words can always be reconstructed from an arbitrary set of two (k) undisturbed code symbols. It is advantageous to use this principle for the construction of the decoder.

FIG. 4 first of all shows the formation of the code symbols (c0, c1, c2, c3) from the data symbols (d0, d1) by means of the generator matrix (FIG. 3, second line). Also shown are the formation of $(2^4)=(k^n)=6$ feasible sets of two code symbols and, using the inverted generator matrix, the reconstruction of the data symbols frowm the respective sets of code symbols.

In order to find the error location(s), first the set of possibly disturbed code symbols received is multiplied in the decoder by an extended parity check matrix [Q]. This matrix is shown in FIG. 5 and is derived from the original parity check matrix by multiplication by an auxiliary matrix [A]. The matrix [A] is determined on the basis of the following requirements:

1. all 2×2 sub-matrices of [A] are non-singular, so that any combination of two rows of the matrix [Q] can be used as a parity check matrix for defining the code;

2. each row of the matrix [Q] contains a single symbol $\underline{0}$;

3. the rows of the matrix [A] can be used for recalculating the data symbols in the manner shown in FIG. 4.

For the choice of the matrix [A] various possibilities exist within the limits imposed herein.

FIG. 6 shows a block diagram of a decoder. The code symbols arrive on input 100, that is to say bit-serially, in parallel or mixed. Block 102 is the syndrome former in which the code words are multiplied by the matrix [Q] as indicated. This results in the syndrome symbols s0, s1, s2, s3 which each correspond to a code symbol. If the code symbols are not disturbed, the syndrome equals zero; the use of the additional matrix [A] has no effect thereon. It has been found that the following cases occur:

(a) If no error has occurred in the normal mode, all syndrome symbols have the value zero $(\underline{0})$.

(b) If a one symbol error occurs in the normal mode in the code symbol location i (i∈{0, 1, 2, 3}), the syndrome symbol $s_i=\underline{0}$, while all other syndrome symbols are not equal to zero.

(c) If two one-bit errors occur in the code symbol locations i, j (i≠j), the associated syndrome symbols are indicated by the restriction:

$$s_i \epsilon \{a^v, a^{v+1}, a^{v+2}, a^{v+3}\}$$

$$s_j \epsilon \{a^w, a^{w+1}, a^{w+2}, a^{w+3}\}$$

in which $a^v=h_{ij}$, $a^w=h_{ji}$, and $h_{ij}$ is the element of the matrix [Q] in row i and column j. The error locator can be exactly determined from these data in all cases. For example, when the code symbols c3 and c2 are disturbed, the symdromes s3 and s2 are both elements of the set ($a^0$, $a^1$, $a^2$, $a^3$). The reverse is also applicable.

Combinations which do not satisfy one of the above relations for the syndrome symbols cannot be corrected in the normal mode. Combinations which satisfy one of the above relations for the syndrome symbols, however, may also be due to a non-correctable fault or even by a non-detectable fault.

During operation in an erasure mode, for example for the supposedly incorrect code symbol in the code symbol location, this code symbol is ignored. If not further error occurs in the code word, the syndrome symbol $S_i=0$. When a one-bit error occurs in the code symbol location j, the following is applicable:

$$s_j \in \{a^v, a^{v+1}, a^{v+2}, a^{v+3}\},$$

in which $a^v=h_{ij}$ in accordance with the earlier definition. The block 102 of FIG. 6 thus forms the four syndrome words s0, s1, s2, s3 on its relevant outputs for each code word. These syndrome words are applied to the blocks 104 and 106.

Block 104 is the data reconstruction device, for which purpose it receives the four syndrome symbols and, moreover the (possibly disturbed) code symbols on input 100. In block 104, $(k^n)=6$ versions of the data word are formed, each time on the basis of a different sub-set of code symbols which are assumed to be non-disturbed. Thus, the data word $Y_{32}$ which has been reconstructed on the basis of only the code symbols c2 and c3 appears on output 108; the same is applicable to the other outputs of the block 104. In block 106 six signals (FIG. 7b) are derived from the four syndrome symbols received in order to indicate which of the six data symbols reconstructed by the block 104 have been derived from non-disturbed code symbols. FIG. 7a shows the binary representation of the matrix [Q] of FIG. 5 (a binary representation of such a transformation matrix is customary); each of the "1" bits represents a term which must taken into account for the ultimate result by way of an EXCLUSIVE-OR operation.

FIG. 8 shows the respective combinations. It is apparent that the data symbols can be reconstructed by means of the received code symbols by bitwise addition (modulo-2) of data symbols and code symbols, and by means of two additional functions: $t1=(a^{11}c_3+a^4c_1)$ and $t2=(a^4c_3+a^8c_0)$. These latter functions are formed in the block 104 in accordance with an expression which is also shown in FIG. 7.

Figure 9:
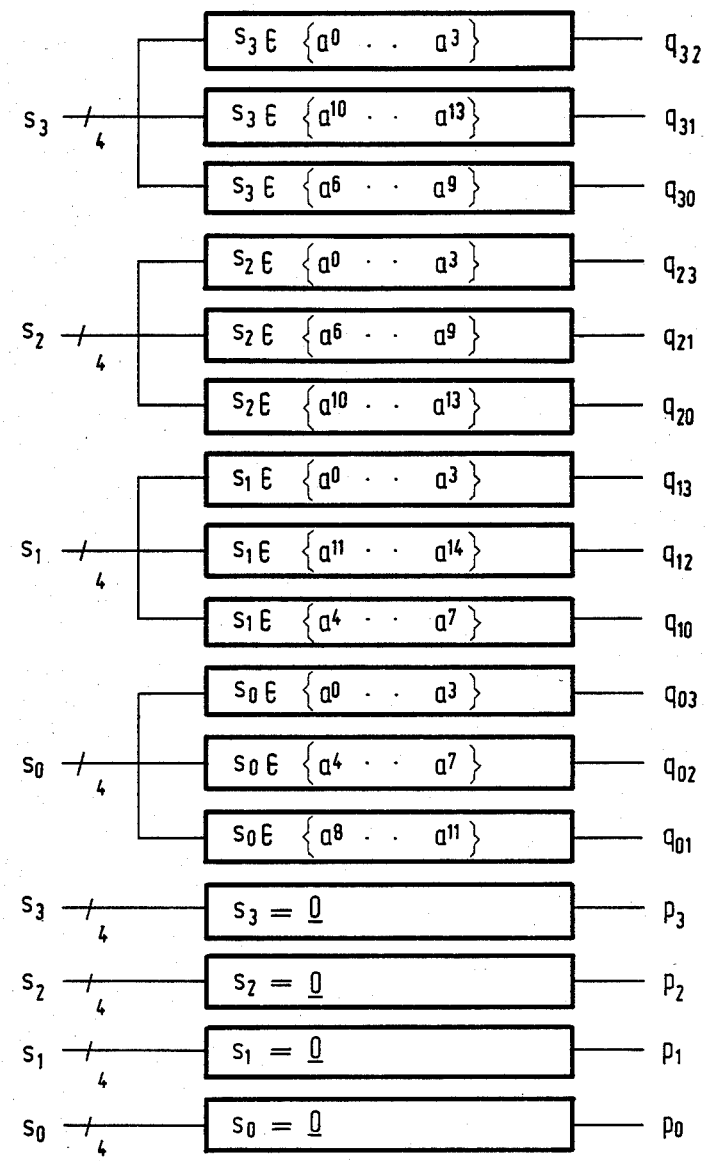
FIG. 9 shows the detector for detecting the associated symbol class for each syndrome symbol.

The steps to be taken for the selection of the appropriate pair from the six symbol pairs formed by the block 104 will be described hereinafter; the signalling takes place in block 106. FIG. 9 indicates symbolically which logic functions of the syncrome symbols are formed. For example, if the syndrome symbol s1 must form part of the set ($a^4$, $a^5$, $a^6$, $a^7$), this symbol is compared bit-wise with each of the four relevant elements of the Galois field $GF(2^4)$ of FIG. 1. This condition has already been mentioned with respect to the localizing of two one-bit errors. When this condition is satisfied, the corresponding output signal bit in FIG. 9 becomes "true".

The decoder can operate in nine different modes, that is to say:

the normal mode, referred to as RM
erasure mode, ignore code symbol "3": EM3
erasure mode, ignore code symbol "2": EM2
erasure mode, ignore code symbol "1": EM1
erasure mode, ignore code symbol "0": EM0
gating mode on code symbols 3 and 2: MOS 32
gating mode on code symbols 3 and 1: MOS 31
gating mode on code symbols 3 and 0: MOS 30
gating mode on code symbols 2 and 1: MOS 21

-continued gating mode on code symbols 2 and 0: MOS 20
gating mode on code symbols 1 and 0: MOS 10

Element 110 of FIG. 6 is a control and signalling register, FIG. 10 shows the embodiment comprising a four-bit mode register and the necessary decoding. FIG. 11 shows the criteria to be satisfied by the signals p and q described and the mode signals to be formed, and also the filling of the error signalling register which also contains four bits. The abbreviations used have the following meaning:

EE: the relevant code symbol is erased
BE: occurrence of a one-bit error
DBE: occurrence of a two-bit error
SSE: occurrence of a one-symbol error
NE: no errors (or: no error detected).

The indices after the letters indicate the number of the code symbol to which the erasure or error localization relates. A "1" in the columns for the variables p and q now indicates that the relevant variable must also have this value. A "0" means that the relevant variable may not have the value "1". If no causal relationship exists, no indication is given. It is to be noted that if $q_{i,j}=1$, $q_{i,k}=0$ for $k \neq j$. Furthermore, if $q_{ij}=q_{ji}=1$, all other variables $q_{kl} \neq 1$.

In this embodiment, the error is actually not corrected but the appropriate pair of code symbols on the basis of which the data symbols must be recovered is selected by error localization. Each correctable error occurs once in the table. The case NE (no errors) occurs twice: the system can thus utilize the first two code symbols (y10) in parallel as well as the last two code symbols (y32) in parallel. This means that the AND-gate 116 as well as 118 of the AND-gate 112 to 122 in FIG. 6 are conductive (these AND-gates each operate over a width of 8 bits). This is because the interface unit 124 comprises, for each bit-line of the 8-bit wide output 126, an OR-gate having six inputs: each of these inputs is fed by a different one of the AND-gate 112 to 122. If there is no error, the two results y32 and y10 are identical. This double definition of the case "NE" saves components as well as time in comparison with other solutions.

Figure 19:
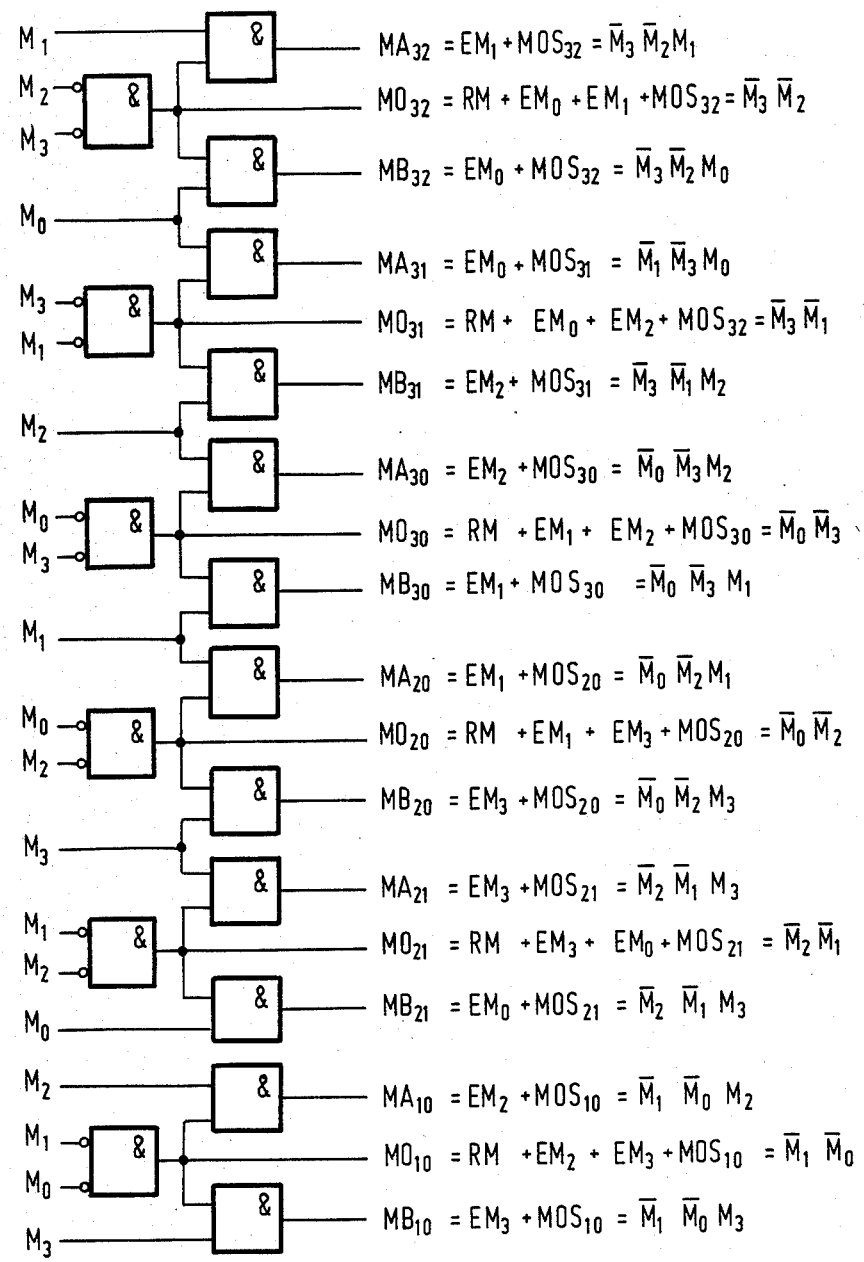
FIG. 19 shows a circuit for deriving a number of control signals from the content of the mode register.

FIG. 12 shows the conditions to be satisfied, for the respective selections from the data y32, y31, y30, y21, y20, y10; these conditions are first shown as a sum of products which follows directly from the table of FIG. 11. Subsequently, they are each shown again as a product of sum terms. This conversion also utilizes the property that the signals RM, $EM_i$ and $MOS_{ij}$ are disjunct: at any instant only one of these eleven signals can be true. These rewritten functions can be realized by means of fewer components and with a small signal delay time. The respective circuits for forming the control signals for the gates 112 to 122 in FIG. 6 are shown in the FIGS. 13, 14, 15, 16, 17, 18. The parts of the functions which depend only on the content of the mode register are shown in FIG. 19.

The error register, forming part of the element 110 in FIG. 6, contains the following information:

(1) if there are no errors, the register contains exclusively zeros;

(2) if one one-bit error or one one-symbol error occurs, the error register contains a single "1" which indicates the associated code symbol;

(3) if two one-bit errors occurs, the error register contains two data "1" which indicate the associated code symbols;

(4) in the erasure mode, the error register contains a "1" for the code symbol in which a one-bit error occurs; all other bits of the error register are zero;

(5) if a detectable, non-correctable error occurs, all bits of the error register are set to "1". The error register thus serves for the signalling of actual errors or previous errors. The mode register, however, serves for the (co)control of the actual operating mode and the selection from the data y32 ... y10. In this embodiment both registers comprise as many bit positions as there are code symbols in the code word. However, other choices are also feasible. For example, in a double-length error register of eight bits, one half is used for signalling the one-bit errors and the other half for signalling one-symbol errors. This extended embodiment will not be elaborated upon herein.

Thus, an error-signalling tetrade is supplied to the error register each time in order to be combined bitwise with the information already stored. This means that it is not possible to distinguish one-symbol errors (successively) occurring in two different code words from a double one-bit error in the same code word. This is not objectionable, because the error register is used for external signalling and not for direct control. The word to be supplied to the error register is shown in FIG. 11 (extreme right-hand column) which illustrates the relationship between the content of the mode register, the various criteria described and the type of error. The selection functions have already been derived from the table of FIG. 11. These functions indicate which version (of the six feasible versions) of the data word is to be used. The content of the error register is partly determined by these selection functions. The conditions under which the first, the second, the third and the fourth bit of the error register are successively made equal to "1" are shown in the FIGS. 20a ... 20d. These bits are also all set to "one" in the case of a detectable but non-correctable error; the relevant condition, however, is not shown in FIGS. 20a ... d. These conditions are derived from the selection functions.

FIGS. 21a ... 21f thus show the functions to be derived from configurations shown in FIGS. 13, 14, 15, 16, 17, 18, respectively. For this purpose use is also made of the property that the variable RM, $EM_i$ and $MOS_{ij}$ are mutually disjunct: at any given instant, at the most one of these variables can have the value "1".

Use is also made of the following functions which can be derived from the table in FIG. 10:

$$RM + EM0 = \overline{M}_1 \cdot \overline{M}_2 \cdot \overline{M}_3 \mid RM + EM2 = \overline{M}_0 \cdot \overline{M}_1 \cdot \overline{M}_3$$
$$RM + EM1 = \overline{M}_0 \cdot \overline{M}_2 \cdot \overline{M}_3 \mid RM + EM3 = \overline{M}_0 \cdot \overline{M}_1 \cdot \overline{M}_2$$

Therein, $M_0 \ldots M_3$ indicate the valves of the relevant mode register bits; a stroke over a variable indicates the inverted value. For example, from a comparison of (34)-(FIG. 12); (35)-(FIG. 20); (40)-(FIG. 21) it can be deduced that the value "1" must be applied to the bit position "0" of the error register subject to the following condition:

(RM+EM1).SEL01.SEL10+(RM+EM2).SEL02-.SEL20+(RM+EM3).SEL03.SEL30=1.

By combination with the expression given above, the conditions shown in the FIGS. 22a ... d are obtained.

These Figures also show the corresponding expressions for the other three bits of the error register.

Figure 23:
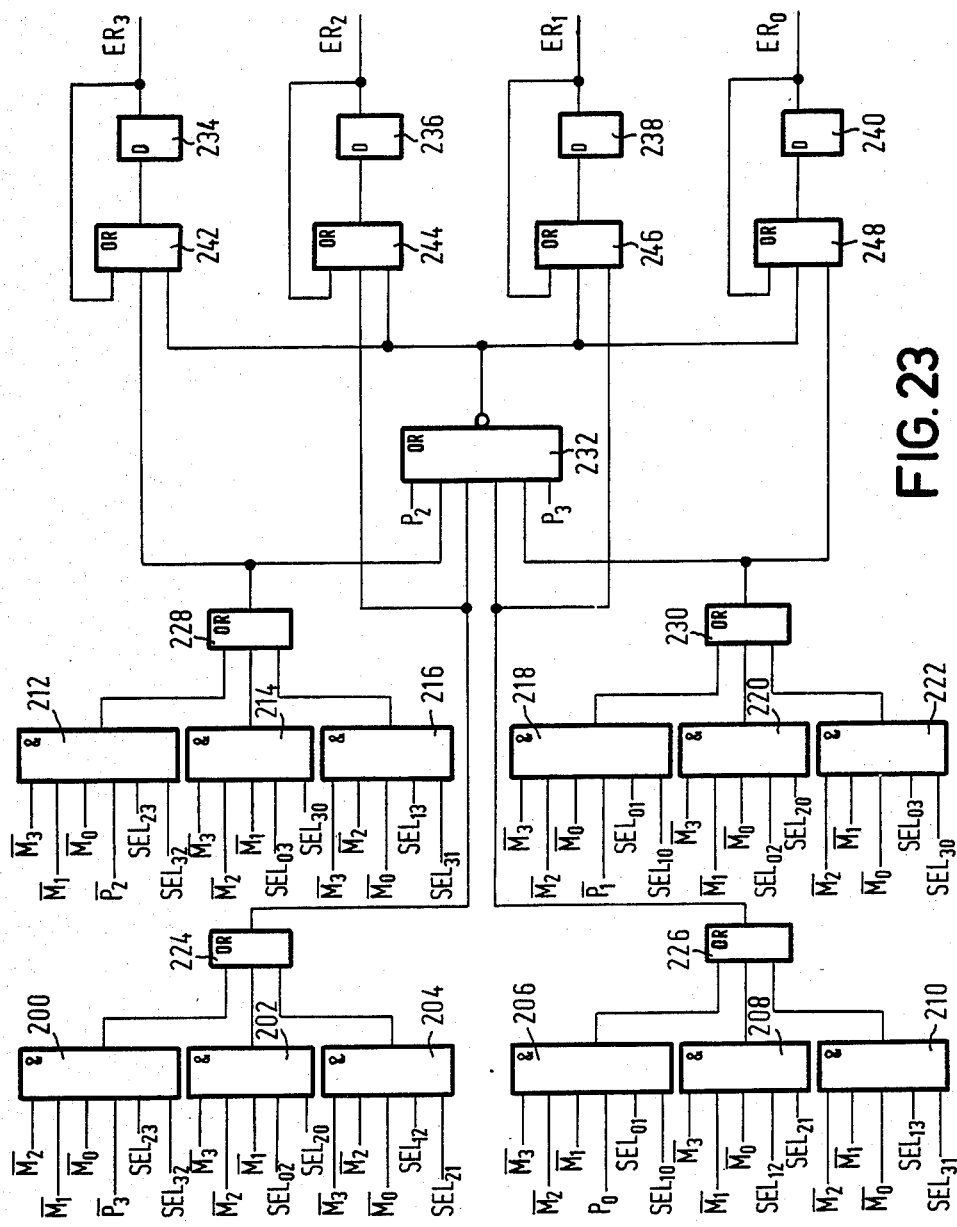
FIG. 23 shows the control device for the error register as a logic circuit.

FIG. 23 shows a realization involving twelve AND-gates (&) 200 ... 222, four OR-gates (OR) 224 ... 230 and a NOR-gate 232 for forming the set conditions. The error register comprises four data flipflops 234 ... 240, whose clock control is not shown. These flipflops also comprise a reset input (not shown). The formation of the OR-function between the old content of the data flipflops and a new error-indicating word is realized by means of the OR-gates 242 ... 248. When a detectable, non-correctable error arises, all syndrome symbols S0, S1, S2, S3 are different from zero. On the other hand, no "one" bit is applied to the error register (by way of the preceding OR-functions). This is due to the fact the previously derived functions react only to a correctable error (by forming the value "1"). This fact is utilized to derive the function which signals a detectable, non-correctable error (a non-detectable error, obviously, does not cause a system response). Therefore, if all four functions of FIG. 22 are not true and, moreover, the functions p2 and p3 have the value zero, a logic "1" is applied to all bit positions of the error register by way of the NOR-gate (inverted output) 232. The error register can be attractively used as a short-term updating device: a number of recent errors can be indicated therein. Alternatively, the error register may be used in a data processing system as follows. The error register is periodically read and reset to zero by a supervision device. This does not have a direct effect on the content of the mode register, as will appear hereinafter. The supervision device operates, for example, under software control. The content of the error register is then used, for example, for long-term updating: the number of error indications occurring over a given period of time is summed for each code symbol. The code symbols whose sums are the lowest can then be evaluated as being the most reliable, so that these symbols are used in the gating mode. The signalling of an uncorrectable error (gate 232) can be used to generate an interrupt signal or to control a retry. Such retries are customary in data processing devices. The sub-operations required for such a retry depend on the kind of device and the actual data processing; for the sake of brevity, they will not be elaborated upon herein.

Figure 24:
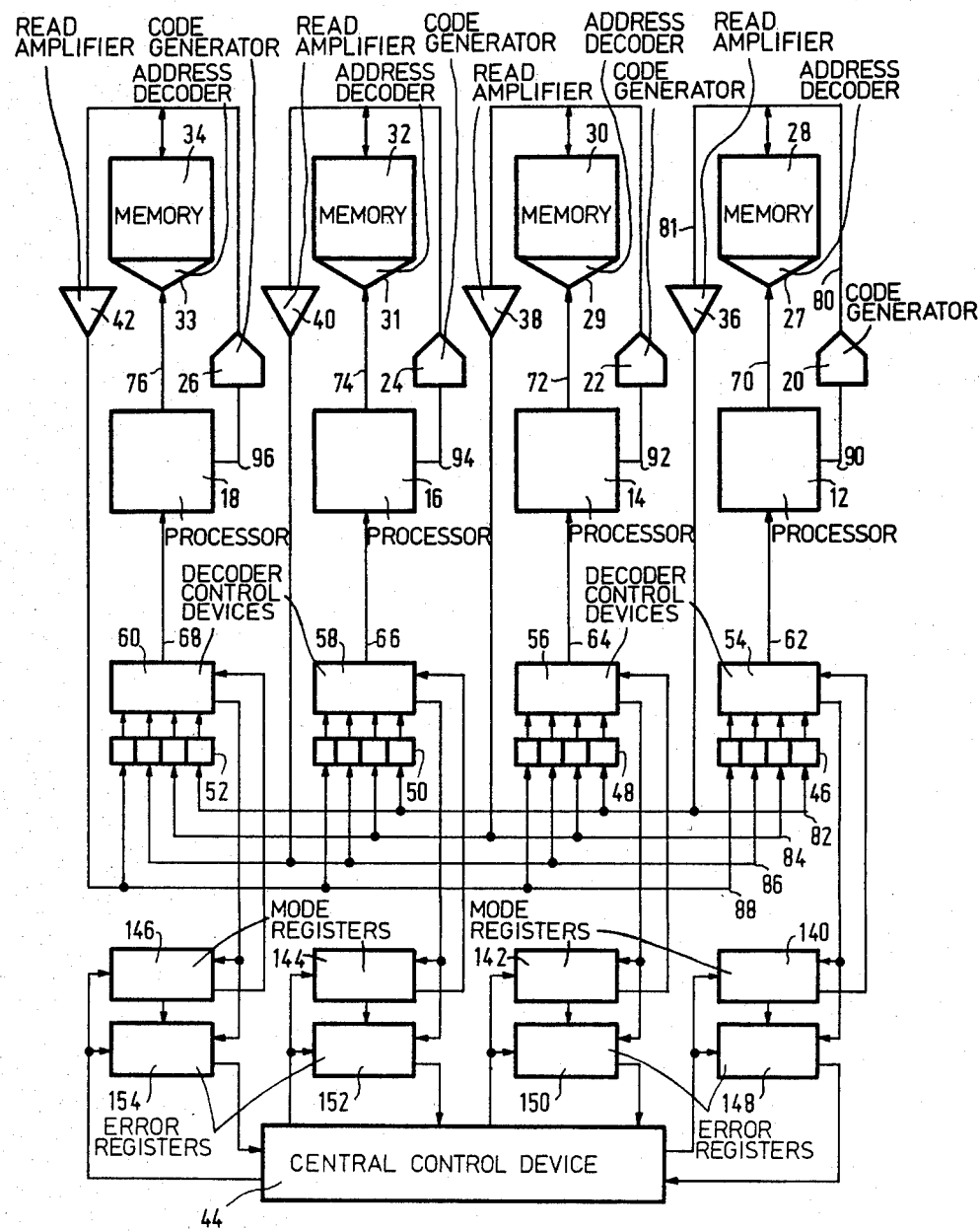
FIG. 24 shows a multiprocessor computer system in which the invention is implemented.

FIG. 24 shows a computer system in which the invention is implemented; the interconnection of the sub-systems has already been partly disclosed in U.S. Pat. No. 4,402,045, be it for use with a less effective error-correcting code. The data words consist of 8 bits which are assumed to be two symbols of four bits. In the quadruple system shown, each data word is processed in each processor and is represented each time by four code bits in the associated memory or on the output of the sub-computer. The data words appear on the lines 62, 64, 66, 68. They are processed in the respective processor elements 12, 14, 16, 18. In reaction thereto, the processor elements generate data result words on the lines 90, 92, 94, 96 or address words on the lines 70, 72, 74, 76. A known memory management unit (not shown) may be provided for each of the relevant memories. The local memories 28, 30, 32, 34 are addressed via the address decoders 27, 29, 31, 33. From each 8-bit data word received, a 4-bit code symbol is formed in each of the code generators 20, 22, 24, 26, so that the code symbols formed from one data word together form one code word. These code symbols are presented to the memories 28, 30, 32, 34 in order to be stored. The code symbols read are regenerated in the read amplifiers 36, 38, 40, 42. The regeneration can alternatively be realized without intermediate storage in the memories. The code symbols can all be applied to all registers 46, 48, 50, 52. These registers are connected to the reconstruction devices or decoders 54, 56, 58, 60 for reconstructing the data words from the code words for presentation to the lines 62, 64, 66, 68. The combination of elements 46, 54, 12, 20, 28 and 36 is included in a single separate error isolation zone and correspondingly for further zones. It is assumed that the errors in two different error isolation zones are independent; in many cases this requirement is satisfied for many categories of errors if each error-isolation zone covers, for example, a separate printed circuit board plus components, or alternatively a separate integrated circuit. The circuit shown in the Figure thus forms four respective error isolation zones. The synchronization of the operations in the four error isolation zones has been omitted for the sake of clarity. The processors operate in accordance with relevant programs. The construction of the sub-systems in the relevant error-isolation zones is similar, except for the code generators (20, 24, 26, 28) which each implement a different algorithm for forming the four respective code symbols from the 8-bit data word. Furthermore, the control of the data reconstruction devices 54, 56, 58, 60 may differ depending on the control mode of the computer system. For the description of the possible interfacing for a peripheral apparatus, reference is made to the afore-said U.S. Pat. No. 4,402,045.

The data reconstruction device may be constructed in accordance with the principle described with reference to FIG. 6. During the erasure mode, all equipment of a selectable error isolation zone (FIA) may be ignored. It has been found that the normal mode which is capable of correcting two arbitrarily situated bit errors or a one-symbol error is very well suited for the correction of errors occurring in the memory. These latter errors usually are mutually independent and, moreover, are often so-called "soft errors". Symbol errors which render an entire symbol unreliable are usually caused by a faulty processor. It has been found that such symbol errors are usually of a permanent nature. However, they need not be repaired at short notice in this computer system, because the decoders can switch over to the erasure mode. The latter policy, however, involves a new risk in that a one-symbol error ($\geq 2$ bits in one symbol) and a further one-bit error could occur at the same time. This cannot be corrected during operation in the normal mode (RM). Therefore, it is important to switch over from the normal mode to the erasure mode as soon as possible. The switch is made subject to the following conditions:

(a) the system is previously in the normal miode ($M_0M_1M_2M_3 = 0000$);

(b) a one-symbol error whose bit weight is at least "2" occurs.

For the code symbol c3, the condition (b) is satifsfied if:

$$S3 = \underline{0} \to p3 = 1$$
$$S1 \quad \{a^0, a^1, a^2, a^3\}; q_{13} = 0$$
$$S1 \neq \underline{0} \to p1 = 0$$
$$RM = 1.$$

(the first and third conditions produce a one-symbol error; the opposite of the second condition produces a one-bit error). The condition is therefore:

$$RM \cdot p3 \cdot \overline{p1} \cdot \overline{q13} = 1.$$

For the other code words, the conditions are:

$$c2: RM \cdot p2 \cdot \overline{p1} \cdot \overline{q12} = 1$$
$$c1: RM \cdot p1 \cdot \overline{p2} \cdot \overline{q21} = 1$$
$$c0: RM \cdot p0 \cdot \overline{p2} \cdot \overline{q20} = 1$$

Furthermore, each error-isolation zone in FIG. 24 comprises a separate error register (148, 150, 152, 154) which is controlled by output signals from the relevant decoder (54, 56, 58, 60) and whose output signals are applied to the central control device 44. Finally there are shown the relevant reset lines for the error registers from the central control unit 44. The multiplicicity of these control lines is not shown. Furthermore, each error-isolation zone in FIG. 24 comprises a respective 4-bit mode register 140, 142, 144, 146. The mode registers are controlled by output signals from the associated decoders (54, 56, 58, 60). The content of each mode register controls the operating mode of the associated decoder. Furthermore, the setting of the error register is co-controlled by the content of the associated mode register. This relation is indicated each time by an additional arrow (parts of the circuit of FIG. 23 would thus be situated in the error register in FIG. 24). Finally, each mode register receives control signals from the central control device 44. The composition of these control lines will be described hereinafter. In the error-free condition, the same program is executed in all isolation zones. This is also applicable in the normal mode. However, if a systematic disturbance occurs in a given error isolation zone, the symbol error having probably the bit weight 2 resulting therefrom is detected in the other isolation zones; these zones will switch over to the erasure mode, so that the faulty isolation zone is no longer taken into account. In the faulty isolation zone itself the signalling need not be absolutely correct; it may even occur that completely different control occurs (for example, due to a failure of the mode register). However, the system as a whole continues to operate correctly thanks to the three other error isolation zones.

Figure 25:
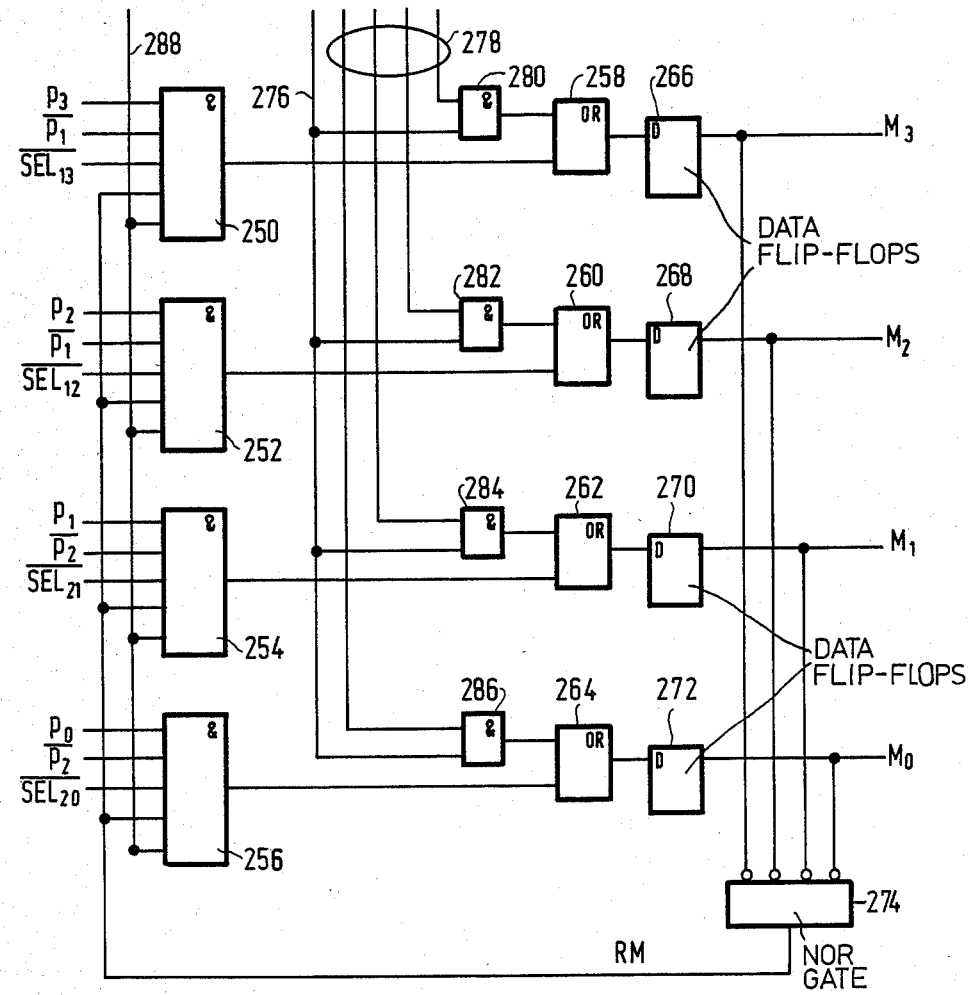
FIG. 25 shows the control device for the mode register as a logic circuit.

FIG. 25 shows the four-bit mode register and the associated control circuit. The condition signals are formed for the revelant mode bits by means of the four AND-gates 250 . . . 256. These condition signals are applied, via the OR-gates 258 . . . 264, to the register proper which is formed by four data flipflops 266 . . . 272. The clock control of these data flipflops is not shown separately. The output data are combined in NOR-gate 274: the output signal thereof (RM) indicates the normal mode. The circuit furthermore comprises an additional control input 276 and a four-bit data input 278. Using four AND-gates 280–286, random external information can be input, for example under the control of the residential software of the control device 44 of FIG. 24. For example, the gating mode can be initiated under the influence of the long-term updating of the detected errors.

Figure 13:
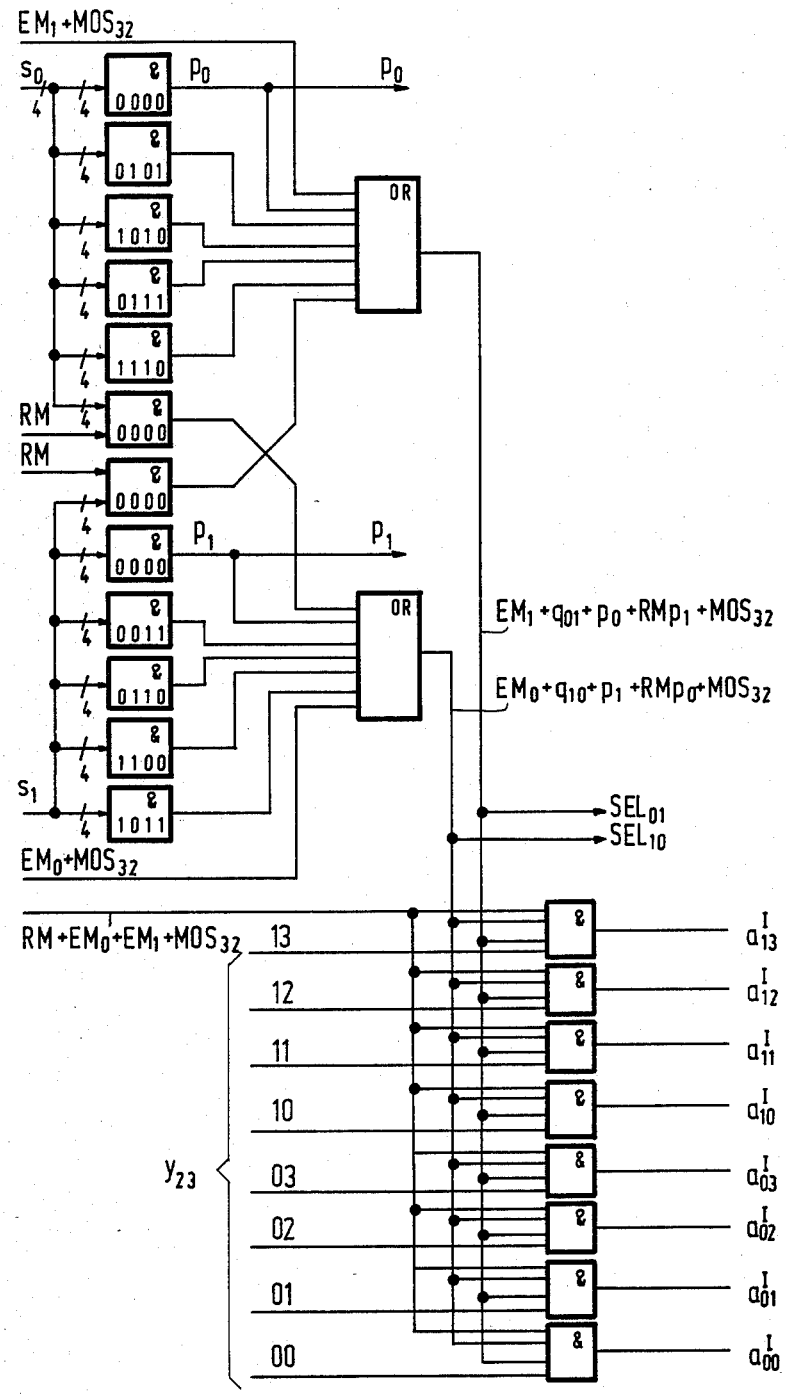
FIG. 13 shows the circuit for the selection of the version y32 of the data symbols.
Figure 14:
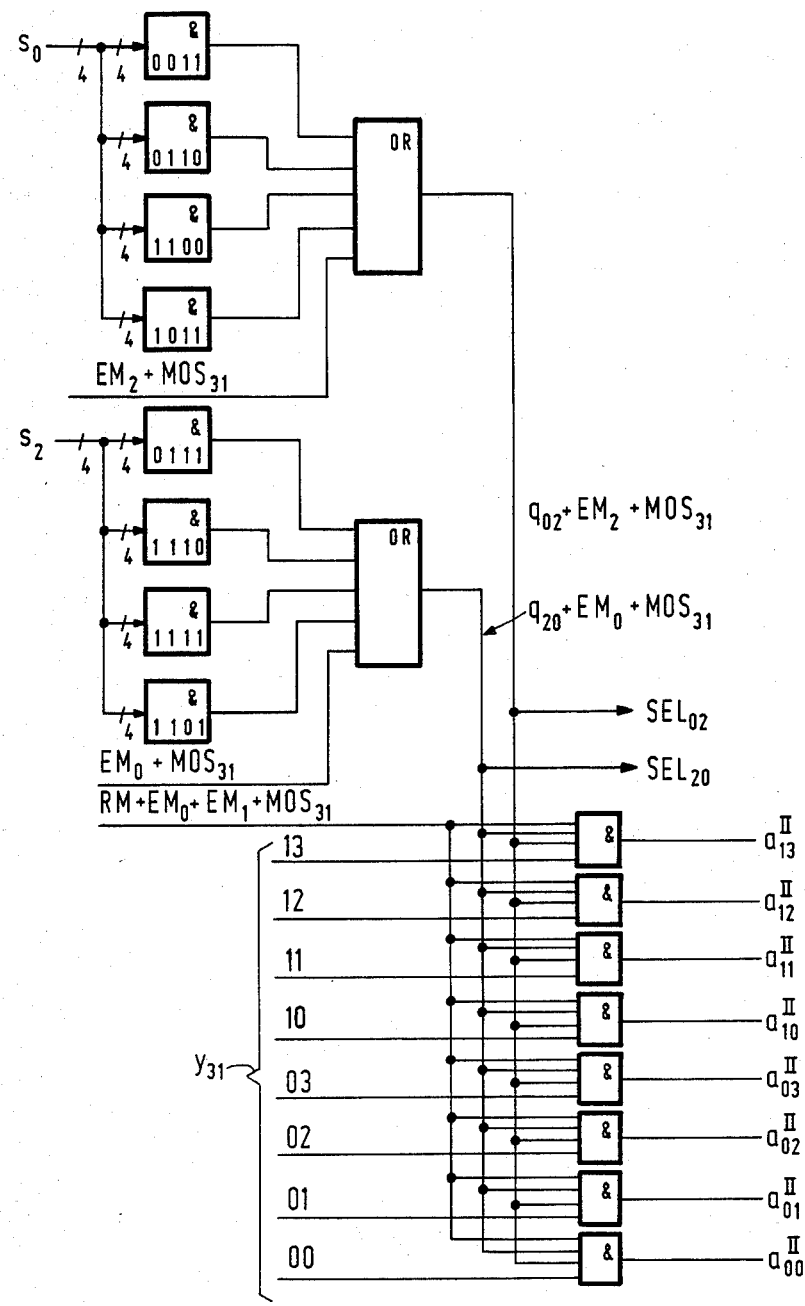
FIG. 14 shows the circuit for the selection of the version y31.
Figure 15:
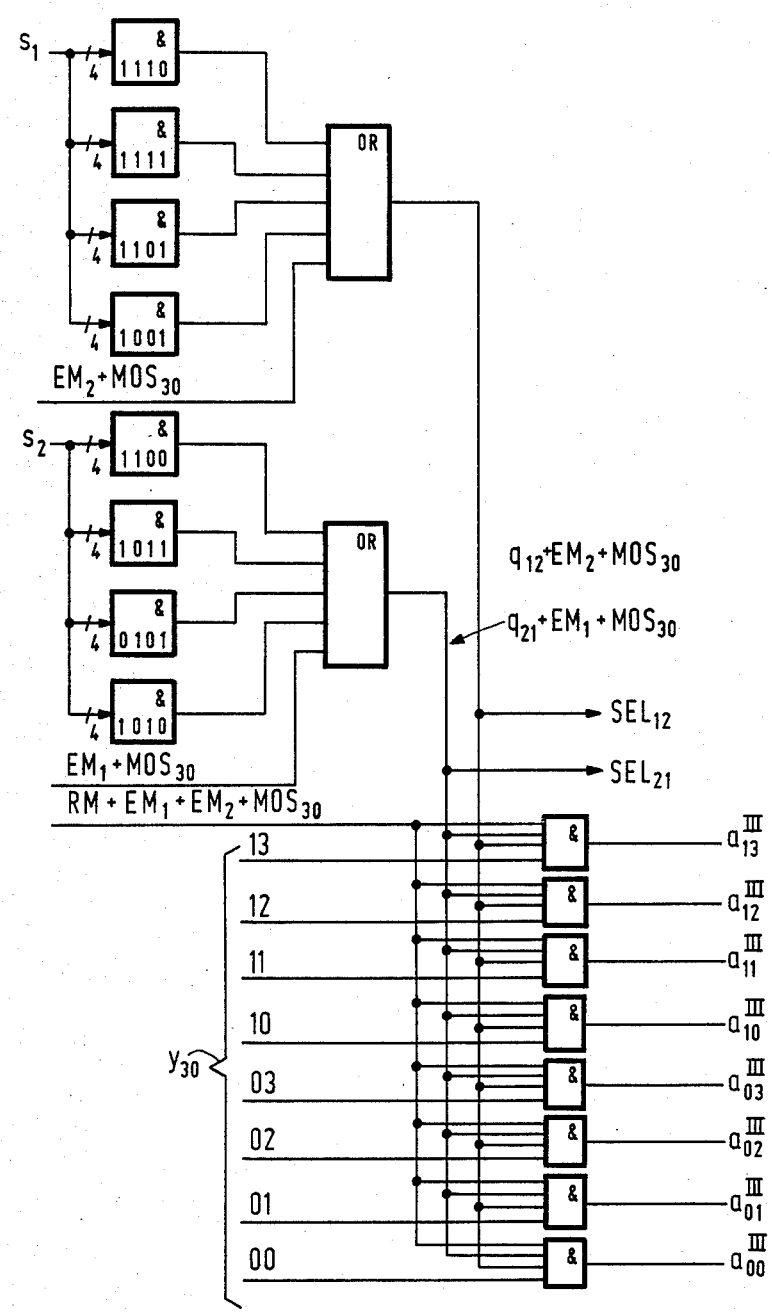
FIG. 15 shows the circuit for the selection of the version y30.
Figure 16:
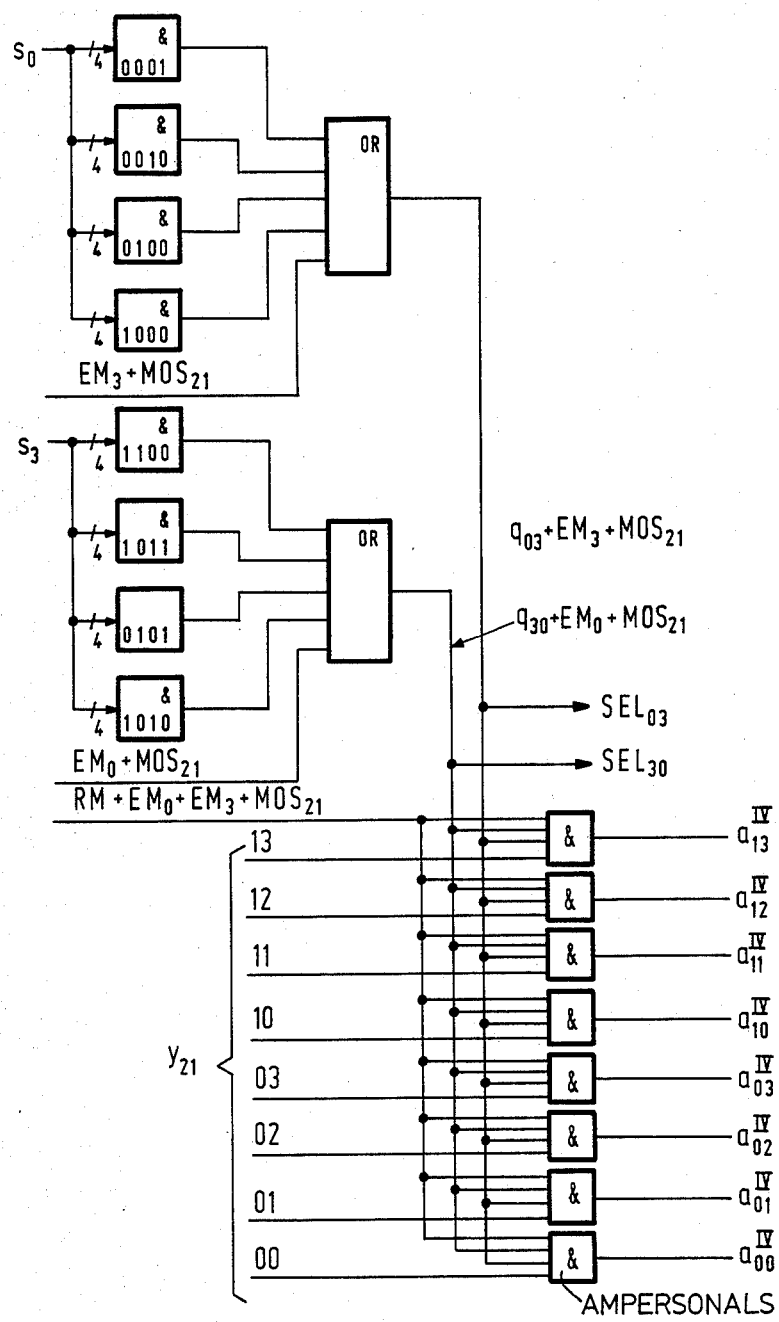
FIG. 16 shows the circuit for the selection of the version y21.
Figure 17:
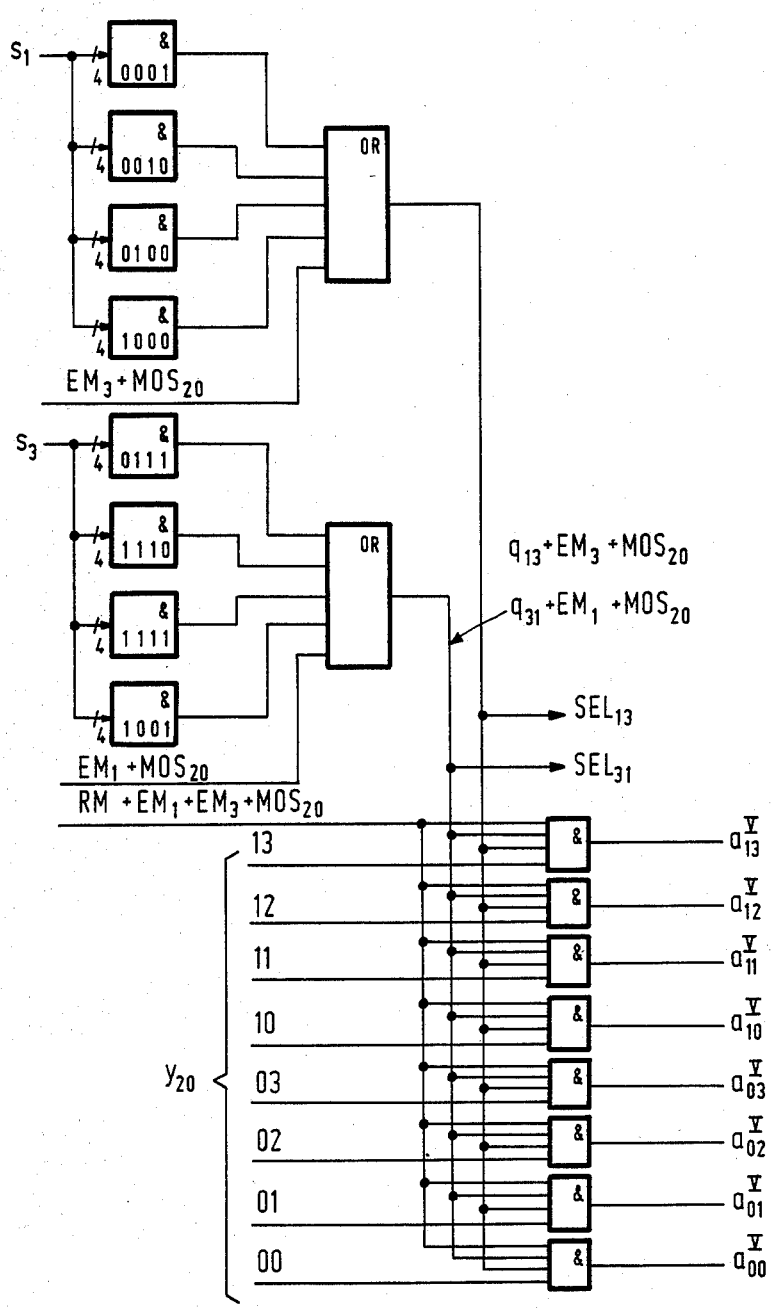
FIG. 17 shows the circuit for the selection of the version y20.
Figure 18:
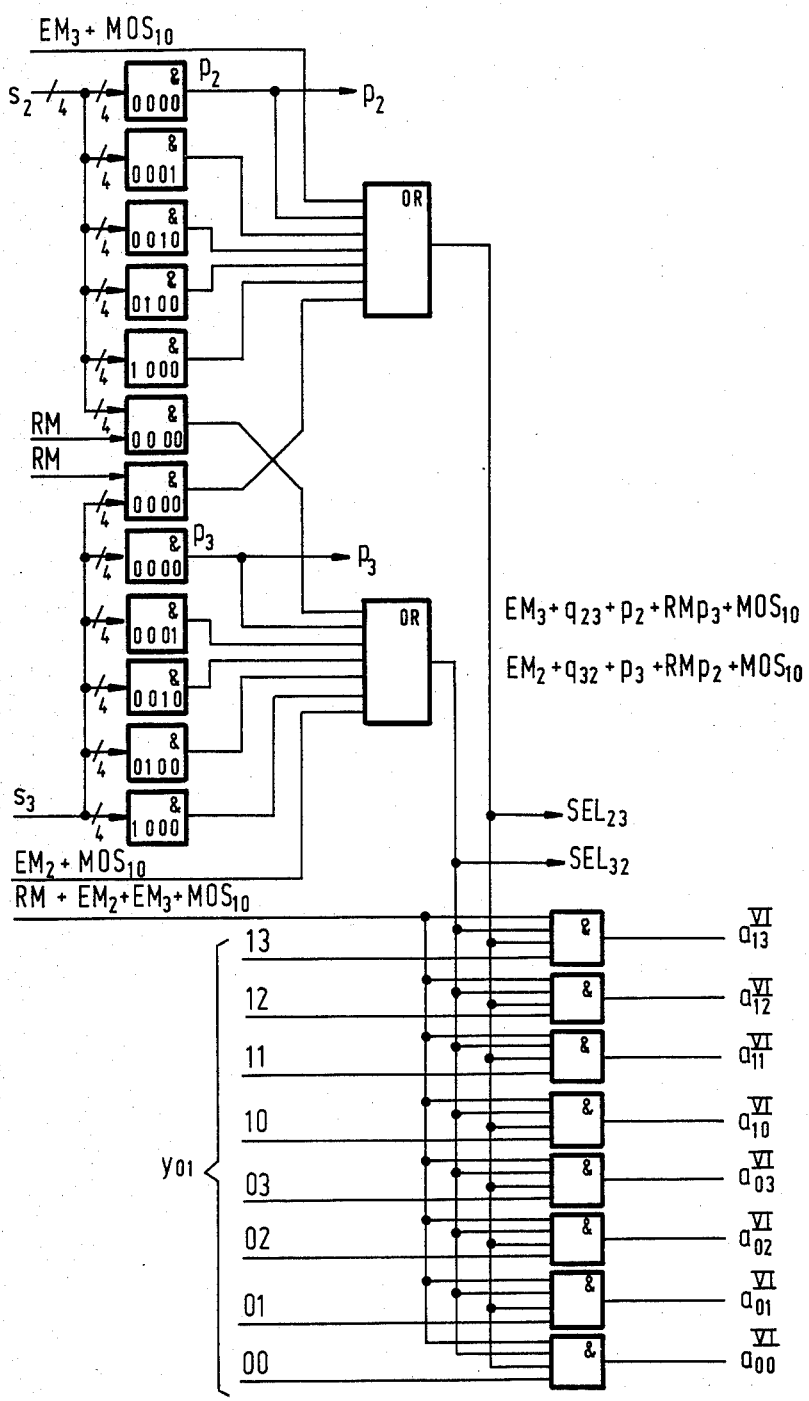
FIG. 18 shows the circuit for the selection of the version y10.

The condition signals for the mode register bits are also derived from the functions $SEL_{ij}$ formed in the FIGS. 13 ... 18; for example, for the flipflop 266:

$$RM \cdot p3 \cdot \overline{p1} \cdot SEL_{13} = RM \cdot p3 \cdot \overline{p1} \; (q13 + EM3 + MOS20) =$$

$$RM \cdot p3 \cdot \overline{p1} \cdot \overline{q13} \cdot \overline{EM3} \cdot \overline{MOS20} = RM \cdot p3 \cdot \overline{p1} \cdot q13$$

(because, if RM=1, EM3 and MOS20 are equal to zero). A "1" signal on the control input 288 then acts as an enable signal. This signal may be formed only in given data processing phases, for example when all detection signals ($p_i$, $SEL_{ij}$) have come to a rest.

Figure 26:
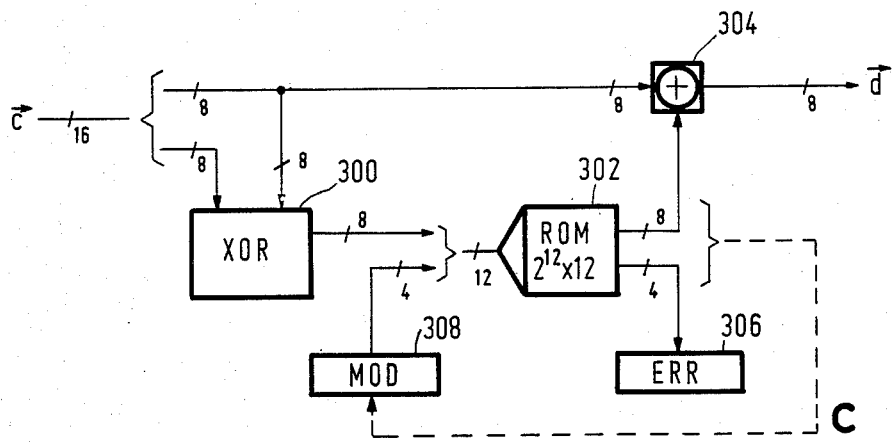
FIG. 26 shows a further embodiment of the decoder.

FIG. 26 shows a first alternative for the decoder, which alternative utilizes a preprogrammed read-only memory (ROM). First of all, an 8-bit syndrome is formed from the 16-bit code word by means of an exclusive OR-matrix (300). This syndrome contains the complete information concerning the error. Therefore, an 8-bit correction word can be formed by means of a read-only memory 302. This correction word can be added bit-wise modulo-2 to the two data symbols (304) in order to reconstruct the non-disturbed data word. Furthermore, the four signal bits to be applied to the error register 316 are to be formed at the same time. Since the system can operate in different modes, the read-only memory must also receive the four bits from the mode-register 308, because the interpretation of the syndrome is co-determined by the mode. Therefore, the read-only memory should have a capacity of $2^{12}$ words of 12 bits. FIG. 25 also shows the binary version of the parity check matrix. This can be implemented by means of 38 two-input EXCLUSIVE OR gates. When these gates are arranged in a tree-like configuration, the implementation of this matrix introduces a delay of only three gate delay times. The interaction between mode register and error register takes place in the manner of FIG. 23 and is not shown separately; the further control of the mode register 308 is not shown separately either.

It is alternatively possible to implement the parity check matrix with a further read-only memory. To this end, only the non-identity part of the parity check matrix (at the top right in FIG. 26) is used:

$$(\vec{s}) = \begin{pmatrix} a^6 & a^{10} \\ a^{10} & a^6 \end{pmatrix} \cdot \begin{pmatrix} c_1 \\ c_0 \end{pmatrix}$$

The result is added to $c_3$, $c_2$ (EXCLUSIVE-OR) in order to produce the two-symbol result $\vec{s}$. The latter is used exactly as shown in FIG. 26. The code can also be used for longer data words. For example, a 16-bit data word can be split directly into four symbols of four bits; these symbols are treated pair-wise each time. Evidently, a larger variation is then possible for dividing the system into a number of error isolation zones. Furthermore, the methods described are not restricted to symbols comprising at the most four bits.

What is claimed is:

1. A data processing device for the processing of data words which are composed of $k=2p-2$ data symbols by means of code words which are formed from the associated data words by means of an error-correcting code, said code words containing $n=2p$ code symbols, all symbols consisting of $m=2s$ bits and forming part of a Galois field $GF(2^m) = 0, a^0, a^1 \ldots a^{2m-2}$, p and s being integers equal or greater than 2, said device comprising a first input for a data word, first multiplier means for multiplying the data word by a generator matrix (G) consisting of n×k matrix elements each of m bits in order to form a code word, processing means for processing the code word in order to form a processing result, and reconstruction means for reconstructing, using a parity check matrix $(R) = (S) \cdot (H) \cdot (T)$ which is orthogonal to the generator matrix (G), a second data word associated with the processing result for output for a first output, said reconstruction means comprising mode indicating means (110), for controlling in a first state a "normal" mode for processing code words as forming part of a code providing a minimum Hamming-distance of three over the symbols, and, in n respective erasure states indicating one associated received-symbol position of a code word as erased and for processing the remaining code symbols as a code providing a minimum Hamming-distance of at least three over the bits, wherein (S) is a non-singular matrix of $(mx(n-k)) \times (mx(n-k))$ bits, the matrix (H) comprises a first submatrix of $(n-k) \times (n-k)$ symbols in the form of an identity matrix and a second submatrix of $(n-k) \times k$ symbols whose determinant is not equal to $1 = a^0$, while each $(n-k) \times (n-k)$ symbol submatrix of (H) is non-singular, the matrix (T) consisting of (nm×nm) bits in n×n blocks which are arranged in rows and columns and each of which blocks consists of m×m bits, each row and each column of blocks comprising (n-1) blocks which consist exclusively of "0" bits, each row of bits and each column of bits containing exactly one "1" bit and for the remainder exclusively "0" bits, whereby (H) produces a systematic code, which multiplied by (S) may produce a non-systematic code and multiplied by (T) may produce permutations of symbols or bits within symbols; characterized in that said mode indicating means is a mode register having a third input and a third output and in said first state alternatively controls the processing of code words as forming part of a code providing a minimum Hamming-distance of five over the bits; in that in said second submatrix the absolute values modulo $(2^m - 1)$ of the differences between the exponents of any pair of exponents of symbols written as powers of (a) being at least equal to (m) on each respective row and in each respective column of the matrix (H), in that the reconstruction means comprise:

(a) second multiplier means (102) with a second input for receiving the processing result for multiplication by an extended parity check matrix $(Q) = (A) \times (R)$ of n rows of symbols by n columns of symbols to form a number of (n) syndrome symbols (S0 ... S3) on a second output, wherein (A) is a matrix of (n) rows of symbols and (n-k) columns of symbols, wherein all $(n-k) \times (n-k)$ submatrices of A are non-singular so that any combination of (n-k) rows of matrix (Q) may be used as a parity check matrix, and wherein each row of matrix (Q) contains exactly one zero symbol;

(b) a data reconstruction device (104) with a fourth input (100) for receiving the processing result and a fifth input for receiving the syndrome symbols, and with a fourth output Y32, Y31, Y30, Y21, Y20, Y10) for forming $(_k{}^n)$ $(_k{}^n)$ versions of a reconstructed data word, each version being generated from an associated unique subset of k code symbols of the received processing result;

(c) a selection device (106) with a sixth input which is connected to the second output in order to receive the syndrome symbols and a seventh input which is connected to the third output in order to receive the state information from the mode register and also provided with a sixth output which is connected to the third input and a seventh output for supplying, on the basis for the syndrome symbols and the state of the mode register, a selection signal for indicating which of the $(_k{}^n)$ $(_k{}^n)$ versions of the reconstructed data word is derived from non-disturbed code symbols and supplying an update signal for the mode register;

(d) a gating device (112–122), with inputs which are connected to the fourth output and the seventh output for the selection of an error-free data word.

2. A data processing device for the processing of data words which are composed of $k=2p-2$ data symbols by means of code words which are formed from the associated data words by means of an error-correcting code, said code words containing $n=2p$ code symbols, all symbols consisting of $m=2s$ bits and forming part of a Galois field $GF(2^m)=0, a^0, a^1 \ldots [a^{2-m-2}] a^{2m-2}$, p and s being integers equal or greater than 2, said device comprising a first input for a data word, first multiplier means for multiplying the data word by a generator matrix (G) consisting of (n×k) elements each of m bits in order to form a code word, processing means for processing the code word in order to form a processing result, and reconstruction means for reconstructing, using a parity check matrix (R) which is orthogonal to generator matrix (G), a second data word associated with the processing result for output on a first output, said reconstruction means comprising:

(a) mode indicating means (110) having a third input and a third output for in a first state controlling a "normal" mode processing the code words as forming part of a code providing a minimum Hamming-distance of three over the symbols, and in n respective erasure states indicating one associated received-symbol position of a code word as erased while processing the remaining code systems as a code providing a minimum Hamming-distance of at least three over the bits;

(b) second multiplier means (300) with a second input for receiving the processing unit for multiplication by a parity check matrix $(R)=(S)\cdot(H)\cdot(T)$ in order to form a number of at least (n−k) syndrome symbols on a second output, wherein (S) is a non-singular matrix of $(m\times(n-k))\times(m\times(n-k))$ bits, the matrix (H) comprises a first submatrix of $(n-k)\times(n-k)$ symbols in the form of an identity matrix and a second submatrix of $(n-k)\times k$ symbols whose determinant is not equal to $\underline{1}=a^0$, while each $(n-k)\times(n-k)$ symbol submatrix of (H) is non-singular, the matrix (T) consists of nm×nm bits in n×n blocks which are arranged in rows and columns and each of which consists of (m×m) bits, each row and each column of blocks comprising (n−1) blocks which consists exclusively of "0" bits, each column and each row or bits containing exactly one "1" bit and for the remainder exclusively "0" bits; whereby the matrix (H) produces a systematic code, which multiplied by (S) may produce a non-systematic code and multiplied by (T) may produce permutations by symbols or bits within symbols; characterized in that in said second submatrix the absolute values module $(2^m-1)$ of the differences between the exponents of symbols written as powers of (a) being at least equal to (m) on each respective row and in each respective column of the matrix (H), in that said mode indicating means is a n bit mode register (308) and in said first state alternatively processes the code words as forming part of a code providing a minimum Hamming-distance of five over the bits, (c) correction determining means (302) which have an eighth input which is connected to the second output in order to receive the syndrome symbols and a ninth input which is connected to the third output in order to receive state information from the mode register, and also having an eight output for supplying a corrector and a ninth output for supplying an error indication signal, the latter output being connected to the third input of the mode register;

(d) correction means (304) which have a tenth input for receiving at least data symbols of the processing result and for modulo-2 addition thereof to the corrector in order to supply a corrected data word on a tenth output;

(e) an error register is provided (306) which comprises at least n bit locations, an eleventh input which is connected in parallel with the third input of the mode register in order to receive upon detection of a correctable error in a symbol, a symbol indicator which is to be stored in the associated position of the error register, and the symbol indicators received in the error register (306) are continuously combined with a stored symbol indicator by means of a symbol-wise logic OR-function (242, 248), the error register having an eleventh output for connection to an updating and control device, and also a rest input for receiving a reset signal from the control device.

3. A data processing device as claimed in claim 1 or 2, characterized in that for n=4, k=2, the matrix [H] is chosen from:

$$[H_1] = \begin{bmatrix} a^0 & \underline{0} & a^6 & a^{10} \\ \underline{0} & a^0 & a^{10} & a^6 \end{bmatrix}$$

in which $(a^i)$ is an element of the Galois field $GF(2^4)$ generated by means of the primitive and irreducible polynomial $\lambda(x)=x^4+x+1$, and $$[H_2] = \begin{bmatrix} a^0 & \underline{0} & a^5 & a^9 \\ \underline{0} & a^0 & a^9 & a^5 \end{bmatrix}$$

in which $a^j$ is an element of the Galois field $GF(2^4)$ generated by the primitive and irreducible polynomial $\pi'(x)=x^4+x^3+1$.

4. A data processing device as claimed in claim 1 or 2, characterized in that the mode register contains n bits, each of which is uniquely assigned to a respective code symbol within the code word in order to control the erasure mode therefor.

5. A data processing device as claimed in claims 1 or 2, characterized in that there is provided an error register (110, 306) which comprises at least n bit locations and an eleventh input which is connected in parallel with the third input of the mode register in order to receive, upon detection of a correctable error in a symbol, a symbol indicator which is to be stored in the associated position of the error register, the symbol indicators received being continuously combined with a stored symbol indicator by means of a symbolwise logic OR-function (242-248), the error register having an eleventh output for connection to an updating and control device, and also a reset input for receiving a reset signal from the control device.

6. A data processing device as claimed in claim 5, characterized in that the mode register has an additional data input (278) and a load control input (276) for receiving a control word from the control device in order to control the data processing device in a gating mode so that a data word is reconstructed by the selective erasure of (n−k) code symbols on the basis of the k code symbols then remaining, without correction of errors.

7. A data processing device as claimed in any of the claims 1 or 2, characterized in that there is provided a detector for detecting a multi-bit one-symbol error in the normal mode and for directly switching over the mode register to the erasure mode in reaction thereto, code symbols having the same symbol number as that in which the multi-bit one-symbol error occurred being subsequently erased.

8. A multiprocessor computer system which is composed of n sub-computers which are situated in respective error isolation zones and which each comprise, for use in a data processing device as claimed in any of the claims 1 or 2, a data reconstruction device for receiving all code symbols of a code word to be processed and for reconstructing therefrom a data word, processor means for processing the data word in the same way as in the other sub-computers, a code generator for forming a code symbol from a processed data word so that the set of code symbols thus generated forms a code word, a memory for storing the code symbol formed, and an output for a code symbol, characterized in that each sub-computer furthermore comprises its own mode register and its own error register for the control of the processing of the code symbols and the temporary storage of a detected error, respectively.

* * * * *